(12) United States Patent
Ozeki et al.

(10) Patent No.: US 9,232,636 B2
(45) Date of Patent: Jan. 5, 2016

(54) FLEXIBLE PRINTED WIRING BOARD AND LAMINATE FOR PRODUCTION OF FLEXIBLE PRINTED WIRING BOARD

(75) Inventors: Takayoshi Ozeki, Osaka (JP); Yohsuke Ishikawa, Mie (JP); Yoshiaki Esaki, Osaka (JP); Hiroyuki Fukusumi, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 81 days.

(21) Appl. No.: 13/992,189

(22) PCT Filed: Feb. 18, 2011

(86) PCT No.: PCT/JP2011/053568
§ 371 (c)(1),
(2), (4) Date: Jun. 6, 2013

(87) PCT Pub. No.: WO2012/086219
PCT Pub. Date: Jun. 28, 2012

(65) Prior Publication Data
US 2013/0256002 A1    Oct. 3, 2013

(30) Foreign Application Priority Data
Dec. 21, 2010    (JP) .................................. 2010-284236

(51) Int. Cl.
*B32B 3/00*    (2006.01)
*H05K 1/02*    (2006.01)
(Continued)

(52) U.S. Cl.
CPC .............. *H05K 1/0281* (2013.01); *C08G 59/54* (2013.01); *C08G 59/623* (2013.01); *C08G 69/48* (2013.01);
(Continued)

(58) Field of Classification Search
USPC .............. 428/209, 355 EP, 901; 174/250–258
See application file for complete search history.

(56) References Cited

U.S. PATENT DOCUMENTS 2,941,956 A    6/1960 Bergstrom
6,103,977 A *  8/2000 Namgung ..................... 174/255
(Continued)

FOREIGN PATENT DOCUMENTS

CN    101426340 A    5/2009
JP    08-020653 A    1/1996
(Continued)

OTHER PUBLICATIONS

Tod. W. Campbell et al., "Carbodiimides. IV. High Polymers containing the Carbodiimate Repeat Unit", The Journal of Organic Chemistry, Aug. 1963, vol. 28, pp. 2069-2075.
(Continued)

*Primary Examiner* — Humera Sheikh
*Assistant Examiner* — Seth Dumbris
(74) *Attorney, Agent, or Firm* — McDermott Will & Emery LLP

(57) ABSTRACT

The flexible printed wiring board according to the present invention includes a first flexible insulating layer, a first conductor wiring laminated on the first insulating layer, a second single-layered insulating layer laminated on the first insulating layer, as it covers the first conductor wiring, and a second conductor wiring laminated on the second insulating layer. The first conductor wiring has a thickness in the range of 10 to 30 μm, a line width in the range of 50 μm to 1 mm, and a line gap in the range of 50 μm to 1 mm. The thickness from the surface of the first conductor wiring to the surface of the second insulating layer is in the range of 5 to 30 μm. The surface waviness of the part of the second insulating layer covering the first conductor wiring is 10 μm or less.

18 Claims, 3 Drawing Sheets

(51) Int. Cl.
 C08G 69/48 (2006.01)
 C08L 77/00 (2006.01)
 H05K 1/03 (2006.01)
 H05K 3/46 (2006.01)
 C08G 59/54 (2006.01)
 C08G 59/62 (2006.01)
 C08L 63/00 (2006.01)

(52) U.S. Cl.
 CPC ............... *C08L 63/00* (2013.01); *C08L 77/00* (2013.01); *H05K 1/0298* (2013.01); *H05K 1/0326* (2013.01); *H05K 1/0346* (2013.01); *H05K 3/4655* (2013.01); *H05K 1/0393* (2013.01); *H05K 2201/0195* (2013.01)

(56) References Cited

U.S. PATENT DOCUMENTS

| | | | | |
|---|---|---|---|---|
| 6,387,505 | B1* | 5/2002 | Imashiro et al. | 428/413 |
| 6,797,345 | B2* | 9/2004 | Okamoto et al. | 428/1.6 |
| 6,979,712 | B2* | 12/2005 | Takanezawa et al. | 525/109 |
| 7,250,575 | B2* | 7/2007 | Nagao et al. | 174/254 |
| 8,715,836 | B2* | 5/2014 | Dobashi et al. | 428/612 |
| 2008/0063838 | A1 | 3/2008 | Kurihara et al. | |
| 2009/0113701 | A1 | 5/2009 | Toyoda | |

FOREIGN PATENT DOCUMENTS

| | | | | |
|---|---|---|---|---|
| JP | 09-064543 | A | 3/1997 | |
| JP | 09-092944 | A | 4/1997 | |
| JP | 2004-335844 | A | 11/2004 | |
| JP | 2007-173343 | A | 7/2007 | |
| JP | 2008-066416 | A | 3/2008 | |
| JP | 2008-235345 | A | 10/2008 | |
| JP | 2008-270497 | A | 11/2008 | |
| JP | 2010-053189 | A | 3/2010 | |
| JP | 2010275375 | * | 12/2010 | ............ C08G 59/60 |
| WO | 2009-0145224 | A1 | 12/2009 | |

OTHER PUBLICATIONS

Chemical Review, 1981, vol. 81, No. 4, pp. 619-621.
International Search Report issued in PCT/JP2011/053568, mailed May 24, 2011.
Chinese First Office Action and Search Report issued in corresponding Chinese Patent Application No. 201180061820.6, mailed on Jul. 27, 2015; 29 pages with English translation.

* cited by examiner

FLEXIBLE PRINTED WIRING BOARD AND LAMINATE FOR PRODUCTION OF FLEXIBLE PRINTED WIRING BOARD

RELATED APPLICATIONS

This application is the U.S. National Phase under 35 U.S.C. §371 of International Application No. PCT/JP2011/053568, filed on Feb. 18, 2011, which claims priority to JP2010-284236, filed on Dec. 21, 2010, the disclosures of which Applications are incorporated by reference herein.

TECHNICAL FIELD

The present invention relates to a multi-layer flexible printed wiring board and a laminate for production of the flexible printed wiring board.

BACKGROUND ART

Many flexible printed wiring boards have been used in small-low-profile electronic devices and flat electronic devices. Recently, further increase of the demand for increase in density and decrease in size of electronic devices lead to increased need for lamination of flexible printed wiring boards while requirements for flexible printed wiring boards increase in quality and cost.

For production of a laminated flexible printed wiring board, it is needed to laminate a core material having an insulating layer (first insulating layer), a polyimide film or the like and a conductor wiring (first conductor wiring), an insulating layer (second insulating layer), and a conductor wiring (second conductor wiring). The second insulating layer and the second conductor wiring can be formed for example by a method of using a metal foil-bonded resin sheet (see Patent Document 1).

The metal foil-bonded resin sheet has a structure consisting of a metal foil and a resin layer in a half-hard condition that are laminated to each other. The resin layer of the metal foil-bonded resin sheet is placed on a core material and the metal foil-bonded resin sheet and the core material are heated under pressure in the state. It leads to fluidization of the resin layer, filling the resin layer in the space between the first conductor wirings and also the resin layer hardens thermally, forming the second insulating layer. During the pressure molding under heat, an elastic cushioning material is placed on the metal foil-bonded resin sheet so that the resin layer easily moves when fluidized, and the metal foil-bonded resin sheet and the core material are pressurized through the cushioning material. The metal foil is then subjected, for example, to etching treatment, to form the second conductor wirings.

Under recent increasing need for further increase in density of flexible printed wiring boards, it is desired that finer conductor wirings and finer components are mounted on a multi-layer flexible printed wiring board.

CITATION LIST

Patent Literatures

Patent Literature 1: WO2009/145224

SUMMARY OF INVENTION

Technical Problem

However in the case of conventional multi-layer flexible printed wiring boards, the finer conductor wiring causes a problem of decrease in accuracy of the position and size especially of the second conductor wiring and also of the position of fine components, if they are mounted thereon. It is thus desired to identify and eliminate the reasons for such problems.

An object of the present invention, which was made as the circumstances above are taken into consideration, is to provide a flexible printed wiring board on which conductor wirings can be formed with high positional and dimensional accuracy and fine components can be mounted at high positional accuracy, and a laminate for production of the flexible printed wiring board.

Solution to Problem

A flexible printed wiring board according to the first invention comprises a first insulating layer that is flexible, a first conductor wiring laminated on the first insulating layer, a second insulating layer that is a single layer and laminated on the first insulating layer, as it covers the first conductor wiring, and a second conductor wiring laminated on the second insulating layer, wherein: the first conductor wiring has a thickness in the range of 10 to 30 μm, a line width in the range of 50 μm to 1 mm, and a line gap in the range of 50 μm to 1 mm; the thickness from the surface of the first conductor wiring to the surface of the second insulating layer is in the range of 5 to 30 μm; and the surface waviness of the part of the second insulating layer covering the first conductor wiring is 10 μm or less.

A flexible printed wiring board according to the second invention comprises a first insulating layer that is flexible, a first conductor wiring laminated on the first insulating layer, a second insulating layer laminated that is formed of multiple layers and on the first insulating layer, as it covers the first conductor wiring, and a second conductor wiring laminated on the second insulating layer, wherein: the first conductor wiring has a thickness in the range of 10 to 30 μm, a line width in the range of 50 μm to 1 mm, and a line gap in the range of 50 μm to 1 mm; the thickness from the surface of the first conductor wiring to the surface of the layer directly laminated on the first insulating layer, among multiple layers constituting the second insulating layer, is in the range of 5 to 30 μm; and the surface waviness of the part of the second insulating layer covering the first conductor wiring is 10 μm or less.

In the first invention, the second insulating layer is preferably made of the hardened product of the first resin layer derived from a metal foil-bonded resin sheet having a metal foil, and the first resin layer in half-hard condition laminated on the metal foil.

In the second invention, the second insulating layer is preferably made of the hardened product of the first resin layer and the second resin layer derived from a metal foil-bonded resin sheet having a metal foil, the second resin layer laminated on the metal foil and the first resin layer in half-hard condition, laminated on an opposite side of the second resin layer from the metal foil.

The resin flow of the first resin layer in the metal foil-bonded resin sheet is preferably in the range of 5 to 25 mass %.

The thickness of the first resin layer in the metal foil-bonded resin sheet is preferably in the range of 10 to 40 μm.

The flexible printed wiring board according to the first or second invention is preferably produced by a method comprising a step of placing and pressure molding the first resin layer of the metal foil-bonded resin sheet on the core material having the first insulating layer and the first conductor wiring, in the step thereof no cushioning material being placed on the metal foil-bonded resin sheet during the pressure molding.

The first resin layer is preferably made from an epoxy resin composition containing an epoxy resin, a curing agent, and a carbodiimide-modified soluble polyamide.

The content of the carbodiimide-modified soluble polyamide in the epoxy resin composition is preferably in the range of 40 to 70 mass %.

The epoxy resin preferably contains a naphthalene skeleton-containing epoxy resin.

The naphthalene skeleton-containing epoxy resin preferably contains at least one compound selected from compounds represented by the following Formulae (1) to (3):

The curing agent preferlably contains at least one of dicyandiamide and aminotriazine novolac resins represented by the following formula (4):

[Formula 2]

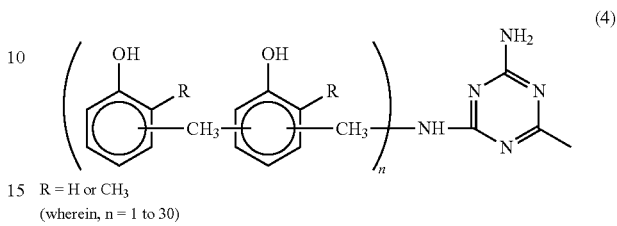

R = H or CH$_3$
(wherein, n = 1 to 30)

[Formula 2]

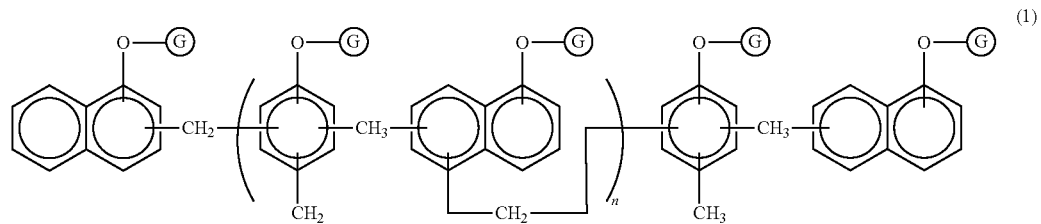

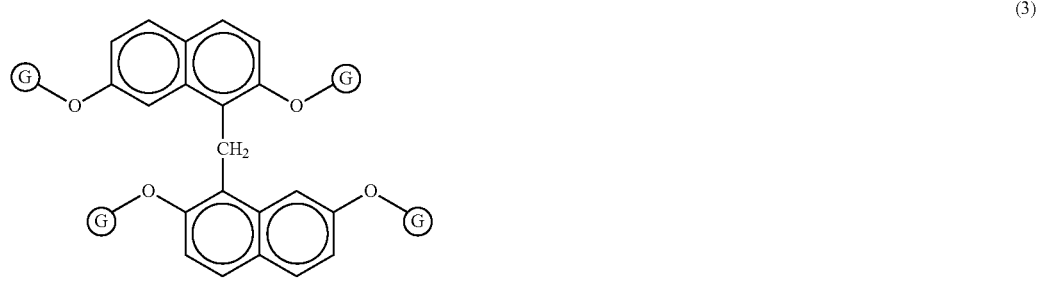

The carbodiimide-modified soluble polyamide preferably contains the reaction product of 100 parts by mass of a soluble polyamide and 0.5 to 20 parts by mass of a carbodiimide compound.

The epoxy resin composition preferably contains a phenoxy resin.

The epoxy resin composition preferably contains at least one compound selected from phosphorus-modified epoxy resins, phosphorus-modified phenoxy resins, and phosphorus-based flame retardants.

Preferably, a through hole is formed in the first insulating layer and part of the second insulating layer fills the through hole.

A laminate for production of a flexible printed wiring board according to the third invention comprises a first insulating layer that is flexible, a first conductor wiring laminated on the first insulating layer, a second insulating layer that is a single layer and laminated on the first insulating layer, as it covers the first conductor wiring, and a metal foil laminated on the second insulating layer, wherein the first conductor wiring has a thickness in the range of 10 to 30 μm, a line width in the range of 50 μm to 1 mm, and a line gap in the range of 50 μm to 1 mm; the thickness from the surface of the first conductor wiring to the surface of the second insulating layer is in the range of 5 to 30 μm; and the surface waviness of the part of the second insulating layer covering the first conductor wiring is 10 μm or less.

A laminate for a flexible printed wiring board according to the fourth invention comprises a first insulating layer that is flexible, a first conductor wiring laminated on the first insulating layer, a second insulating layer that is formed of multiple layers and laminated on the first insulating layer, as it covers the first conductor wiring, and a metal foil laminated on the second insulating layer, wherein the first conductor wiring has a thickness in the range of 10 to 30 μm, a line width in the range of 50 μm to 1 mm, and a line gap in the range of 50 μm to 1 mm; the thickness from the surface of the first conductor wiring to the surface of the layer directly laminated on the first insulating layer, among the multiple layers constituting the second insulating layer, is in the range of 5 to 30 μm; and the surface waviness of the part of the second insulating layer covering the first conductor wiring is 10 μm or less.

Advantageous Effects of Invention

The present invention provides a flexible printed wiring board on which conductor wirings can be formed with at high positional and dimensional accuracy and fine components can be mounted at high positional accuracy.

DESCRIPTION OF EMBODIMENTS

Figure 1:
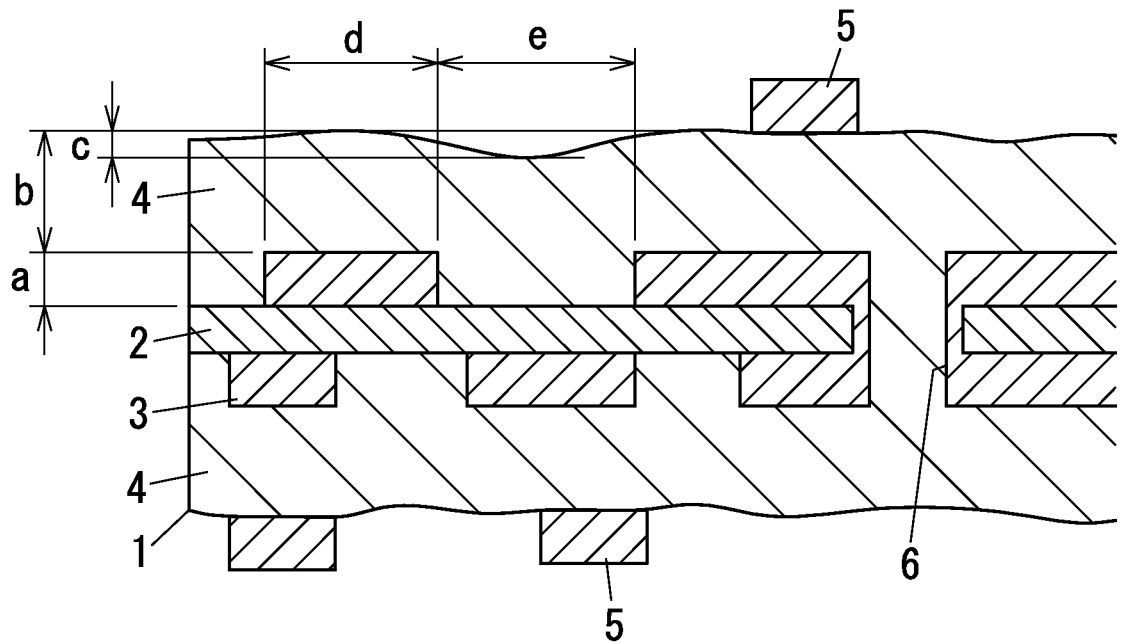
FIG. 1 is a schematic cross-sectional view illustrating a flexible printed wiring board in the first embodiment of the present invention.

A flexible printed wiring board 1 in the first embodiment is shown in FIG. 1. The flexible printed wiring board 1 has a first insulating layer 2, a first conductor wiring 3, a second insulating layer 4, and a second conductor wiring 5.

The first insulating layer 2 is flexible. The first insulating layer 2 is prepared with an insulating material having high-flexibility such as polyimide resin, liquid crystal polymer, polyethylene terephthalate resin or polyethylene naphthalate resin. The thickness of the first insulating layer 2 is selected arbitrarily, but preferably in the range of 12 to 50 μm. The first conductor wiring 3 is formed on a surface of the first insulating layer 2. The first conductor wiring 3 may be formed only on one face of the first insulating layer 2 in the thickness direction or on both faces of the first insulating layer 2 in the thickness direction. In the present embodiment, the first conductor wiring 3 is formed on a first face of the first insulating layer 2 in the thickness direction and additionally on a second face of the first insulating layer 2 in the thickness direction. The first conductor wiring 3 may be formed only on the first face of the first insulating layer 2 in the thickness direction.

The second insulating layer 4 is a single layer. The second insulating layer 4 is laminated on the first insulating layer 2, as the second insulating layer 4 covers the first conductor wiring 3. Part of the second insulating layer 4 fills the space between the lines of the first conductor wiring 3. The second conductor wiring 5 is formed on a surface of the second insulating layer 4. Unless specified otherwise, the surface of the respective components laminated on the first insulating layer 2 sequentially is the surface of the respective components opposite to the first insulating layer 2.

The flexible printed wiring board 1 may have a structure with further more numbers of layers, as it is laminated with an insulating layer and a conductor wiring in addition to those described above.

In the present embodiment, the first conductor wiring 3 have a thickness (indicated by "a" in FIG. 1) in the range of 10 to 30 μm; the first conductor wiring 3 has a line width (indicated by "d" in FIG. 1) in the range of 50 μm to 1 mm; and the first conductor wiring 3 has a line gap (indicated by "e" in FIG. 1) in the range of 50 μm to 1 mm. On the surface of the first insulating layer 2, another conductor wiring different from the first conductor wiring, i.e., a conductor wiring having a thickness not in the range of 10 to 30 μm, a line width not in the range of 50 μm to 1 mm, or a line gap not in the range of 50 μm to 1 mm, may be formed.

The thickness (indicated by "b" in FIG. 1) from the surface of the first conductor wiring 3 to the surface of the second insulating layer 4 is in the range of 5 to 30 μm.

In addition, a surface waviness (indicated by "c" in FIG. 1) of part of the second insulating layer 4 covering the first conductor wiring 3 is 10 μm or less. When a minimum point and two adjacent maximum points having the minimum point in between are selected arbitrarily on the surface waviness curve of the part, the surface waviness is defined as the distance between the straight line circumscribing the two maximum points and the straight line in parallel therewith circumscribing the minimum point. A surface waviness of 10 μm or less means that, if the minimum and maximum points are selected at arbitrary positions as described above, the surface waviness at the arbitrary points on the surface of the part of the second insulating layer 4 covering the first conductor wiring 3 is 10 μm or less, i.e., that the maximum value of the surface waviness is 10 μm or less. The surface waviness is determined, for example, by using a surface roughness meter (type: SURF TEST SV-3000, produced by Mitsutoyo Corporation).

It is possible in this way to preserve the sufficient flexibility of the flexible printed wiring board 1 and increase the accuracy in position and size of the second conductor wiring 5 on the flexible printed wiring board 1 and also in position of fine components mounted on the flexible printed wiring board 1. Thus, when the thickness of the first conductor wiring 3 is in the range of 10 to 30 μm, the first conductor wiring 3 can function sufficiently for example as a signal wiring and the second insulating layer fills the space between the lines of the first conductor wiring 3 more efficiently. Additionally, when the thickness from the surface of the first conductor wiring 3 to the surface of the second insulating layer 4 is in the range of 5 to 30 μm, the first conductor wiring 3 is insulated sufficiently by the second insulating layer 4, while the flexibility of the flexible printed wiring board 1 is preserved sufficiently, and the surface shape of the second insulating layer 4 becomes less influenced by the shape of first conductor wiring 3, suppressing waving of the surface of the second insulating layer 4. Further, when the first conductor wiring 3 has a line width in the range of 50 μm to 1 mm and a line gap in the range of 50 μm to 1 mm, the pattern of the first conductor wiring 3 becomes sufficiently fine, enabling the first conductor wiring 3 to function for example as a signal wiring sufficiently, and the second insulating layer 4 fills the space between the lines of the first conductor wiring 3 more efficiently. Further, when the second insulating layer 4 has a surface waviness of 10 μm or less, the second insulating layer 4 has higher surface smoothness. For the reasons above, the positional accuracy of treatment during the process for preparation of the second conductor wiring 5 by etching or the like, for example the positional accuracy of an etching resist formed during etching treatment, increases, which in turn leads to increase of the accuracy in position and size of the second conductor wiring 5. Further, when the second insulating layer 4 has a smoother surface, fine components can be mounted on the second insulating layer 4 reliably, thus they are mounted at high positional accuracy.

Through holes 6 may be formed in the first insulating layer 2 of the flexible printed wiring board 1. In this case, part of the second insulating layer 4 fills the space in these through holes 6. The diameters of the openings of the through holes 6 are, for example, in the range of 80 μm to 500 μm.

Figure 2:
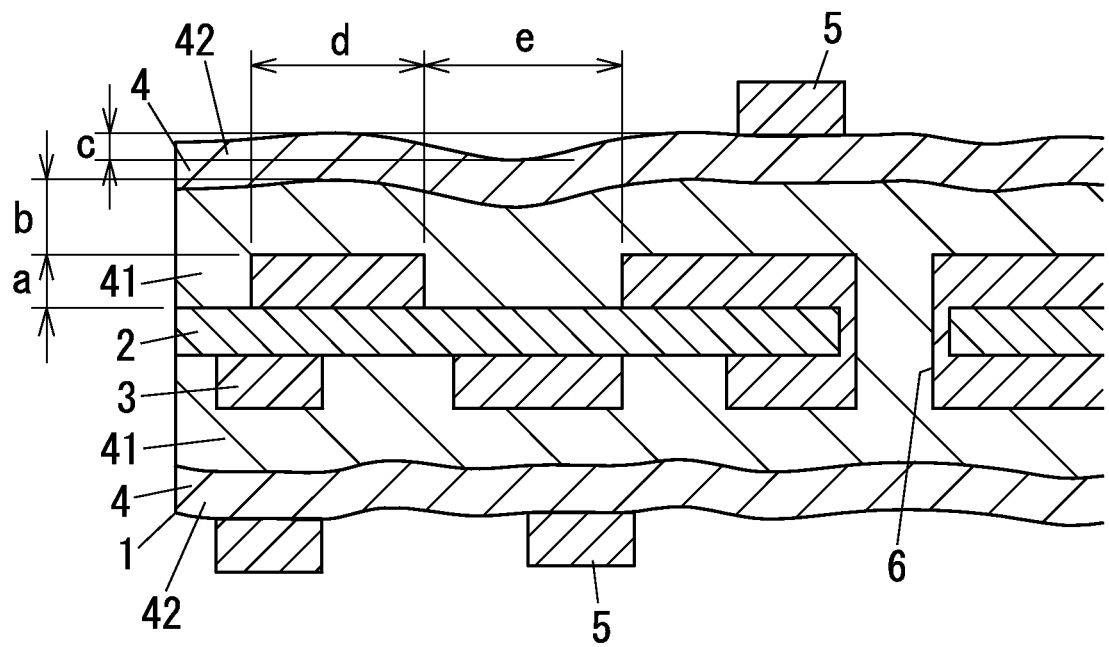
FIG. 2 is a schematic cross-sectional view illustrating a flexible printed wiring board in the second embodiment of the present invention.

A flexible printed wiring board 1 of the second embodiment is shown in FIG. 2. The flexible printed wiring board 1 has a first insulating layer 2, a first conductor wiring 3, a second insulating layer 4, and a second conductor wiring 5.

The first insulating layer 2 is flexible. The first insulating layer 2 is made of an insulating material having high-flexibility such as polyimide resin, liquid crystal polymer, polyethylene terephthalate resin or polyethylene naphthalate resin. The thickness of the first insulating layer 2 is selected arbitrarily, but preferably in the range of 12 to 50 μm. The first conductor wiring 3 is formed on the surface of the first insulating layer 2. The first conductor wiring 3 may be formed only on one face of the first insulating layer 2 in the thickness direction or on both faces of the first insulating layer 2 in the thickness direction. In the present embodiment, the first conductor wiring 3 is formed on the first face of the first insulating layer 2 in the thickness direction and additionally on the second face of the first insulating layer 2 in the thickness direction. The first conductor wiring 3 may be formed only on the first face of the first insulating layer 2 in the thickness direction.

The second insulating layer 4 is laminated on the first insulating layer 2, as the second insulating layer 4 covers the first conductor wiring 3. Part of the second insulating layer 4 fills the space between the lines of the first conductor wiring 3. The second conductor wiring 5 is formed on the surface of the second insulating layer 4.

The second insulating layer 4 includes a third insulating layer 41 and a fourth insulating layer 42. The third insulating layer 41 is laminated on the first insulating layer 2 directly. The fourth insulating layer 42 is laminated on the third insulating layer 41. The second insulating layer 4 may have additionally two or more layers. The fourth insulating layer 42 may have two or more layers.

The flexible printed wiring board 1 may have a structure with further more number of layers, as it is laminated with an insulating layer and a conductor wiring in addition to those described above.

In the present embodiment, the first conductor wiring 3 has a thickness (indicated by "a" in FIG. 2) in the range of 10 to 30 μm; the first conductor wiring 3 has a line width (indicated by "d" in FIG. 2) in the range of 50 μm to 1 mm; and the first conductor wiring 3 has a line gap (indicated by "e" in FIG. 2) in the range of 50 μm to 1 mm. On the surface of the first insulating layer 2, another conductor wiring different from the first conductor wiring, i.e., a conductor wiring having a thickness not in the range of 10 to 30 μm, a line width not in the range of 50 μm to 1 mm, or a line gap not in the range of 50 μm to 1 mm, may be formed.

The thickness (indicated by "b" in FIG. 2) from the surface of the first conductor wiring 3 to the surface of the third insulating layer is in the range of 5 to 30 μm.

In addition, surface waviness (indicated by "c" in FIG. 2) of the surface of the part of the second insulating layer 4 covering the first conductor wiring 3 is 10 μm or less. When a minimum point and two adjacent maximum points having the minimum point in between are selected arbitrarily on the surface waviness curve of the part, the surface waviness is defined as the distance between the straight line circumscribing the two maximum points and the straight line in parallel therewith circumscribing the minimum point. A surface waviness of 10 μm or less means that, if the minimum and maximum points are selected at arbitry positions as described above, the surface waviness at any point on the surface of the part of the second insulating layer 4 covering the first conductor wiring 3 is 10 μm or less, i.e., that the maximum value of the surface waviness is 10 μm or less. The surface waviness is determined, for example, by using a surface roughness meter (type: SURF TEST SV-3000, produced by Mitsutoyo Corporation).

It is possible in this way to preserve the sufficient flexibility of the flexible printed wiring board 1 and increase the accuracy in position and size of the second conductor wiring 5 on the flexible printed wiring board 1 and also in position of fine components mounted on the flexible printed wiring board 1. Thus, when the thickness of the first conductor wiring 3 is in the range of 10 to 30 μm, the first conductor wiring 3 can function sufficiently for example as a signal wiring and the second insulating layer fills the space between the lines of the first conductor wiring 3 more efficiently. Additionally, when the thickness from the surface of the first conductor wiring 3 to the surface of the third insulating layer 41 is in the range of 5 to 30 μm, the first conductor wiring 3 is insulated sufficiently by the third insulating layer 41, while the flexibility of the flexible printed wiring board 1 is preserved sufficiently, and the surface shape of the second insulating layer 4 becomes less influenced by the shape of first conductor wiring 3, suppressing waving of the surface of the second insulating layer 4. Further, when the first conductor wiring 3 has a line width in the range of 50 μm to 1 mm and a line gap in the range of 50 μm to 1 mm, the pattern of the first conductor wiring 3 becomes sufficiently fine, enabling the first conductor wiring 3 to function for example as a signal wiring sufficiently, and the second insulating layer 4 fills the space between the lines of the first conductor wiring 3 more efficiently. Further, when the second insulating layer 4 has a surface waviness of 10 μm or less, the second insulating layer 4 has higher surface smoothness. For the reasons above, the positional accuracy of treatment during the process for preparation of the second conductor wiring 5 by etching or the like, for example the positional accuracy of the etching resist formed during etching treatment, increases, which in turn leads to increase of the accuracy in position and size of the second conductor wiring 5. Further, when the second insulating layer 4 has a smoother surface, fine components can be mounted on the second insulating layer 4 reliably, thus they are mounted at high positional accuracy.

Through holes 6 may be formed in the first insulating layer 2 of the flexible printed wiring board 1. In this case, part of the second insulating layer 4 fills the space in these through holes 6. The diameters of the openings of the through holes 6 are, for example, in the range of 80 μm to 500 μm.

Hereinafter, the components constituting the flexible printed wiring board 1 in the first and second embodiments and the method for producing the flexible printed wiring boards 1 will be described in detail.

The first insulating layer 2 and the first conductor wiring 3 are formed, for example, with a flexible laminated sheet. The flexible laminated sheet is configured with the first insulating layer 2 and a metal foil laminated on one or both faces of the first insulating layer 2. Specifically, the flexible laminated sheet has a first conductor wiring 3 on the first face of the first insulating layer 2 in the thickness direction and a first conductor wiring 3 on the second face of the first insulating layer 2 in the thickness direction, or the first conductor wiring 3 only on the first face of the first insulating layer 2 in the thickness direction. The materials, favorable thickness and others for the first insulating layer 2 were already described. The flexible laminated sheet is formed, for example, by adhesion or thermal bonding of a metal foil such as copper foil on the first insulating layer 2.

The first conductor wiring 3 is formed by treatment of the metal foil on the flexible laminated sheet, for example, by etching. Additionally, the through holes 6 may be formed by forming openings in the first insulating layer 2 and plating in the openings. It is possible in this way to obtain a core material 11 including of the first insulating layer 2 and the first conductor wiring 3 (see FIG. 3).

The second insulating layer 4 is formed on the core material 11. The second insulating layer 4 is formed, for example, by using a material having a resin layer. In this case, the second insulating layer 4 is formed from the resin layer. A favorable example of the material having a resin layer is a resin sheet 9 with a metal foil.

Figure 3A:
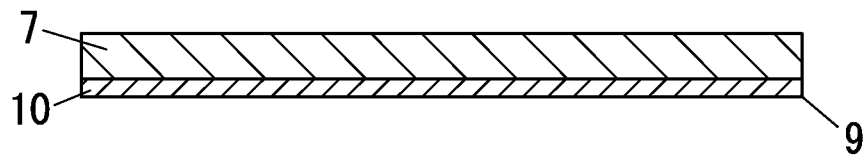
FIG. 3A is a schematic cross-sectional view illustrating a metal foil-bonded resin sheet for production of the flexible printed wiring board in the first embodiment.
Figure 3B:
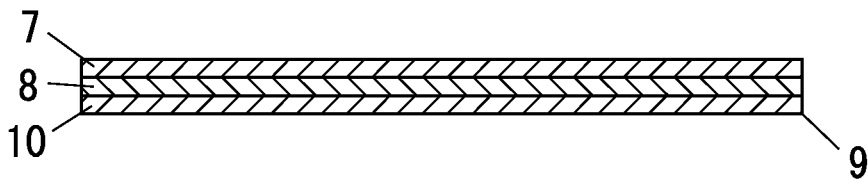
FIG. 3B is a schematic cross-sectional view illustrating a metal foil-bonded resin sheet for production of the flexible printed wiring board in the second embodiment.

As shown in FIG. 3A, the metal foil-bonded resin sheet 9 used for preparation of the flexible printed wiring board in the first embodiment has a first resin layer 7 in the semi-hardened state and also a metal foil 10, such as copper foil, that is laminated on the first resin layer 7 directly. As shown in FIG. 3B, the metal foil-bonded resin sheet 9 used for preparation of the flexible printed wiring board in the second embodiment has a first resin layer 7 in the semi-hardened state, a second resin layer 8 different from the first resin layer 7 and a metal foil 10 such as copper foil in the structure in which the first resin layer 7, the second resin layer 8, and the metal foil 10 are laminated sequentially in that order. The first resin layer 7 is prepared, for example, with a semi-hardened thermosetting resin composition.

Figure 4:
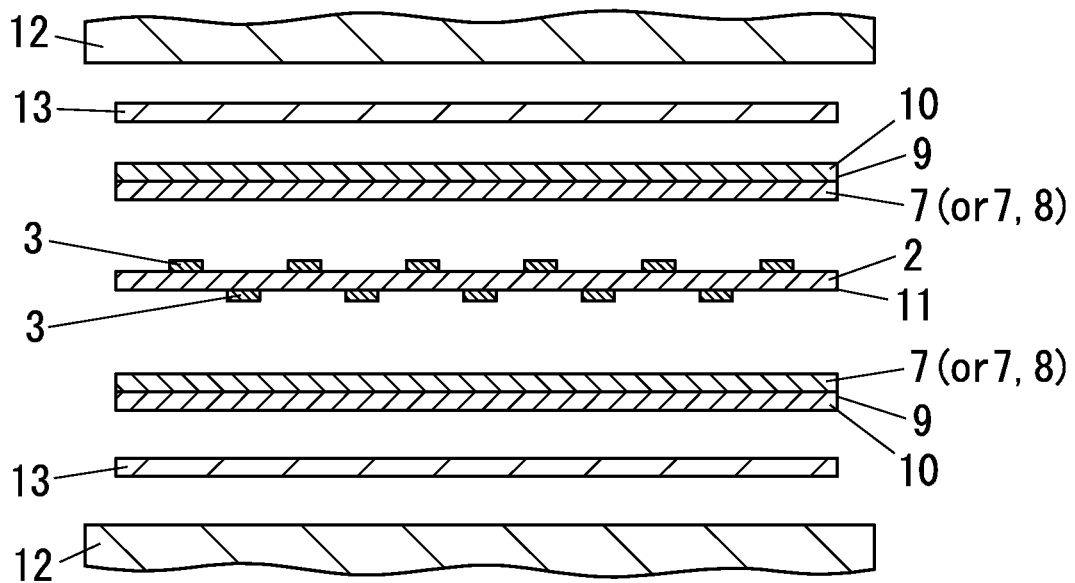
FIG. 4 is a schematic cross-sectional view illustrating an example of the process for producing the flexible printed wiring boards in the first and the second embodiments.

As shown in FIG. 4, in preparation of the flexible printed wiring board in the first embodiment, the metal foil-bonded resin sheet 9 is placed on one or both faces of the core material 11 with the first resin layer 7 covering the first conductor wiring 3. In the present embodiment, a metal foil-bonded resin sheet 9 is placed on the first face of the core material 11 in the thickness direction and additionally another metal foil-bonded resin sheet 9 is placed on the second face of the core material 11 in the thickness direction. The metal foil-bonded resin sheet 9 may be placed only on the first face of the core material 11 in the thickness direction. The metal foil-bonded resin sheet 9 and the core material 11 are pressurized in the lamination direction of these materials and also heated in the state. In this way, the first resin layer 7 first softens, filling itself into the space between the lines of the first conductor wiring 3, and also filling itself into the through holes 6 if through holes 6 are present in the first insulating layer 2. The first resin layer 7 then hardens under heat. Thus, the hardened product of the first resin layer 7 forms the second insulating layer 4.

Figure 5:
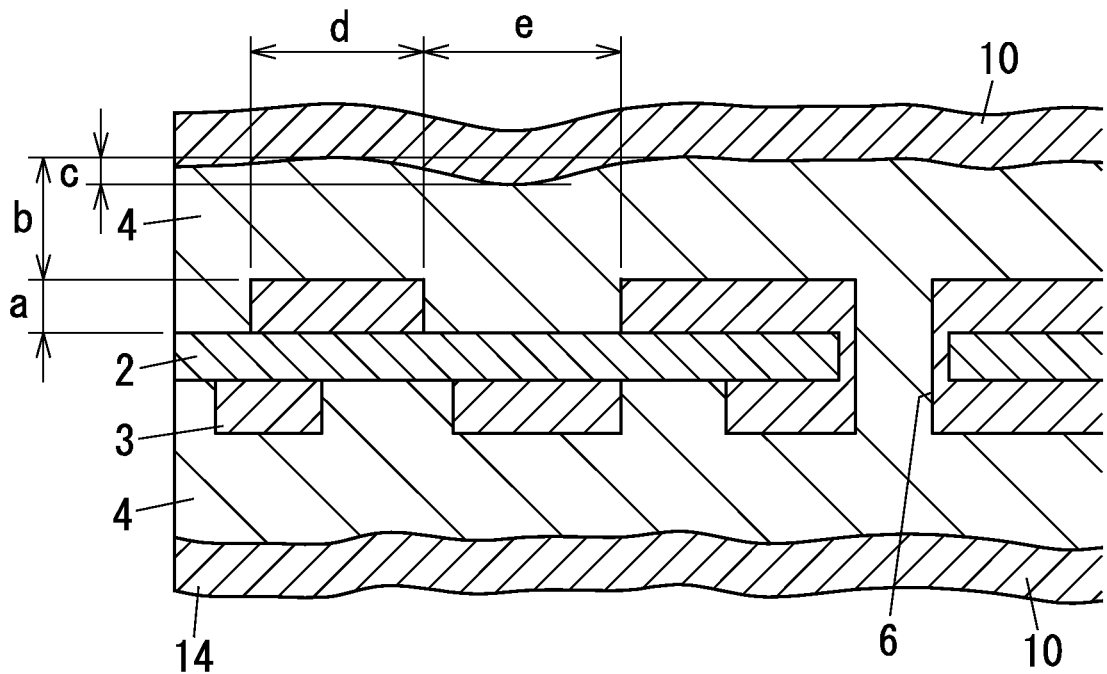
FIG. 5 is a schematic cross-sectional view illustrating an example of a laminate for production of a flexible printed wiring board used for production of the flexible printed wiring board in the first embodiment.

Integration of the core material 11 and the metal foil-bonded resin sheet 9 by lamination in this way gives a laminate 14 for production of a flexible printed wiring board having a structure as shown in FIG. 5, in which the first conductor wiring 3, the second insulating layer 4, and the metal foil 10 are laminated sequentially in that order on one or both faces of the first insulating layer 2. In the present embodiment, the laminate 14 for production of a flexible printed wiring board has a structure in which the first conductor wiring 3, the second insulating layer 4, and the metal foil 10 are laminated sequentially on the first face of the first insulating layer 2 in the thickness direction and additionally the first conductor wiring 3, the second insulating layer 4, and the metal foil 10 are laminated sequentially on the second face of the first insulating layer 2 in the thickness direction. The laminate 14 for production of a flexible printed wiring board may have a structure in which the first conductor wiring 3, the second insulating layer 4 and the metal foil 10 are laminated sequentially only on the first face of the first insulating layer 2 in the thickness direction.

In the laminate 14 for production of a flexible printed wiring board, the thickness (indicated by "a" in FIG. 5) of the first conductor wiring 3 is in the range of 10 to 30 μm, the thickness (indicated by "b" in FIG. 5) from the surface of the first conductor wiring 3 to the surface of the second insulating layer 4 is in the range of 5 to 30 μm. Additionally, the line width (indicated by "d" in FIG. 5) of the first conductor wiring 3 is in the range of 50 μm to 1 mm, while the line gap (indicated by "e" in FIG. 5) of the first conductor wiring 3 is in the range of 50 μm to 1 mm. Further, the surface waviness (indicated by "c" in FIG. 5) of the part of the second insulating layer 4 covering the first conductor wiring 3 on the side facing the metal foil 10 is 10 μm or less. Further, when through holes 6 are formed in the first insulating layer 2 of the flexible printed wiring board 1, through holes 6 are also formed in the first insulating layer 2 of the laminate 14 for production of a flexible printed wiring board.

As shown in FIG. 4, in preparation of the flexible printed wiring board of the second embodiment, a metal foil-bonded resin sheet 9 is placed on one or both faces of the core material 11, with the first resin layer 7 covering the first conductor wiring 3. Although a metal foil-bonded resin sheet 9 is placed on each of the first face of the core material 11 in the thickness direction and the second face thereof in the thickness direction in the present embodiment, the metal foil-bonded resin sheet 9 may be placed only on the first face of the core material 11 in the thickness direction. The metal foil-bonded resin sheets 9 and the core material 11 in the state are placed between a pair of heat plates 12 and pressurized under heat by the heat plates 12. In this way, the first resin layer 7 first softens, filling itself into the space between the lines of the first conductor wiring 3 and also filling the through holes 6 if through holes 6 are present in the first insulating layer 2. The first resin layer 7 then hardens under heat. Thus, the second resin layer 8 or the hardened product becomes the fourth insulating layer 42 and the hardened product of the first resin layer 7 becomes the third insulating layer 41, forming the second insulating 2.

Figure 6:
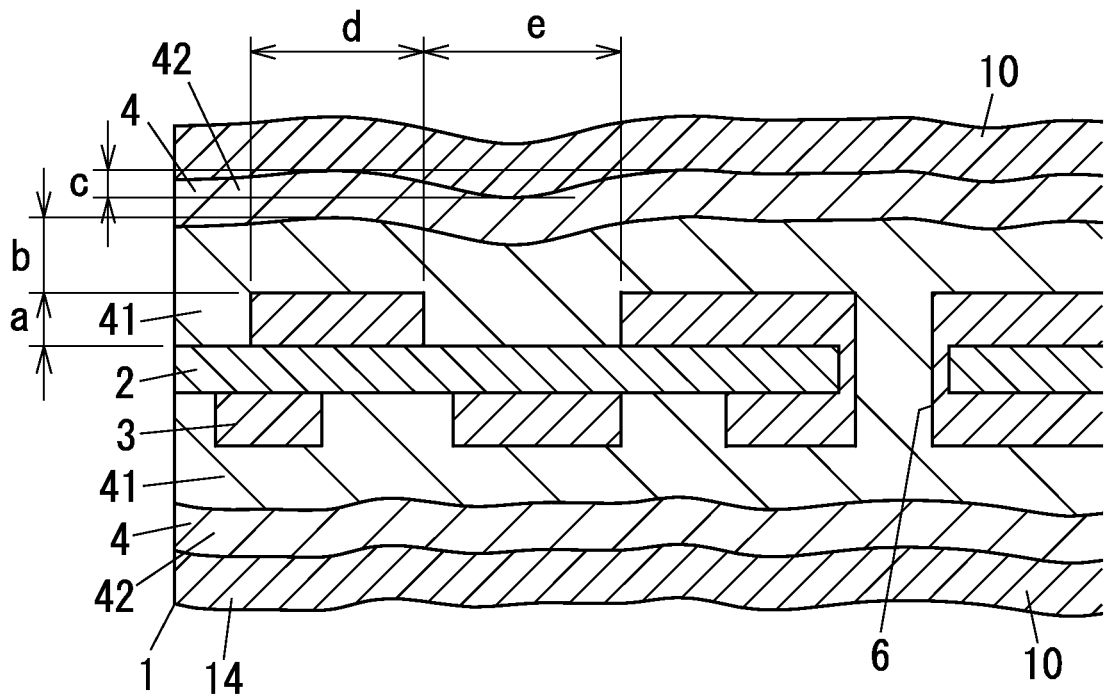
FIG. 6 is a schematic cross-sectional view illustrating an example of a laminate for production of a flexible printed wiring board used for production of the flexible printed wiring board in the second embodiment.

Integration of the core material 11 and the metal foil-bonded resin sheet 9 by lamination in this way gives a laminate 14 for production of a flexible printed wiring board having a structure as shown in FIG. 6, in which the first conductor wiring 3, the second insulating layer 4, and the metal foil 10 are laminated sequentially in that order on one or both faces of the first insulating layer 2; and the second insulating layer 4 has the third insulating layer 41 and the fourth insulating layer 42. In the present embodiment, the laminate 14 for production of a flexible printed wiring board has a structure in which the first conductor wiring 3, the second insulating layer 4, and the metal foil 10 are laminated sequentially in that order on the first face of the first insulating layer 2 in the thickness direction; and the first conductor wiring 3, the second insulating layer 4, and the metal foil 10 are laminated sequentially in that order on the second face of the first insulating layer 2 in the thickness direction. Each second insulating layer 4 has the third insulating layer 41 and the fourth insulating layer 42. The laminate 14 for production of a flexible printed wiring board may have a structure in which the first conductor wiring 3, the second insulating layer 4, and the metal foil 10 are laminated sequentially in that order only on the first face of the first insulating layer 2 in the thickness direction; and the second insulating layer 4 has the third insulating layer 41 and the fourth insulating layer 42.

In the laminate 14 for production of a flexible printed wiring board, the thickness (indicated by "a" in FIG. 5) of the first conductor wiring 3 is in the range of 10 to 30 μm and the thickness (indicated by "b" in FIG. 5) from the surface of the first conductor wiring 3 to the surface of the third insulating layer 41 (interface between the third insulating layer 41 and the fourth insulating layer 42) is in the range of 5 to 30 μm. Alternatively, the line width (indicated by "d" in FIG. 5) of the first conductor wiring 3 is in the range of 50 μm to 1 mm, while the line gap (indicated by "e" in FIG. 5) of the first conductor wiring 3 is in the range of 50 μm to 1 mm. Yet alternatively, the surface waviness (indicated by "c" in FIG. 5) of the part of the second insulating layer 4 covering the first conductor wiring 3 on the side facing the metal foil 10 is in the range of 10 μm or less. Further when through holes 6 are formed in the first insulating layer 2 of the flexible printed wiring board 1, through holes 6 are also formed in the first insulating layer 2 of the laminate 14 for production of a flexible printed wiring board.

The second conductor wiring 5 is formed, as the metal foil 10 in the outermost layer of the laminate 14 is processed by a known method for preparation of wiring, for example by etching. Specifically, for example, an etching resist corresponding to the pattern of the second conductor wiring 5 is formed on the metal foil 10, the region of the metal foil 10 not covered with the etching resist is then removed by etching treatment and the etching resist is then removed. Because the surface waviness of the second insulating layer 4 is smaller, the accuracy in position and shape of the etching resist increases when the etching resist is formed and thus, the accuracy in position and shape of the second conductor wiring 5 formed by the etching treatment also increases. Thus, the flexible printed wiring board 1 in the first or second embodiment is obtained.

In preparation of the flexible printed wiring board 1 in the first or second embodiment, when the metal foil-bonded resin sheet 9 and the core material 11 are pressurized under heat with the heat plates 12, a rigid plate 13 for molding may be present as needed between the metal foil-bonded resin sheet 9 and the heat plate 12. However, a soft or elastic material that is commonly used in production of conventional flexible printed wiring boards 1, (cushioning material, for example, TPX film produced by Mitsui Chemicals, Inc. (trade name: Opulent)) is preferably not present between the metal foil-bonded resin sheet 9 and the heat plate 12. In this case, there is no surface waviness of the second insulating layer 4 generated by deformation of the cushioning material during molding and thus, the second insulating layer 4 becomes smoother.

A resin flow of the first resin layer 7 is preferably in the range of 5 to 25 mass % in these metal foil-bonded resin sheets 9. In measurement of the resin flow, a test piece of 100 mm×100 mm in size is cut off from the metal foil-bonded resin sheet 9 and is pressurized under heat for 10 minutes under the condition of a heating temperature of 170° C. and a pressure of 1.57 MPa (16 kg/cm$^2$). The first resin layer 7 then softens and part of the first resin layer 7 flows out of the metal foil 10. The ratio of the resin flowing out of the metal foil 10 to the total mass of the first resin layer 7 in the test piece is the resin flow. In measurement of the resin flow, it is preferable to heat and pressurize multiple test pieces in a total mass of about 10 g, as they are piled, for accurate control of the pressure and accurate determination of the mass of the resin flowing out of the metal foil 10.

If the resin flow of the first resin layer 7 is in the range above, the first resin layer 7 has high fluidity when the first resin layer 7 softens, filling itself into the space between the lines of the first resin layer 7 or additionally into the space of through holes 6 and thus, the surface waviness of the second insulating layer 4 is suppressed. Even when a cushioning material is not used during pressurization under heat of the member having the first resin layer 7 with the core material 11, because the fluidity of the first resin layer 7 is very high, the first resin layer 7 fills the space between the lines of the first conductor wiring 3 or additionally the space in through holes 6 more efficiently, thus suppressing the surface waviness of the second insulating layer 4 and the filling defects in the spaces between the lines of the first conductor wiring 3 and in the through holes 6.

The thickness of the first resin layer 7 in the metal foil-bonded resin sheet 9 is preferably in the range of 10 to 40 μm. When the thickness of the first resin layer 7 is 10 μm or more, the surface waviness of the second insulating layer 4 is suppressed sufficiently and the softened first resin layer 7 fills the space between the lines of the first conductor wiring 3 or additionally in through holes 6 particularly efficiently. Alternatively, when the thickness of the first resin layer 7 is 40 µm or less, the increase in thickness of the second insulating layer 4 is restricted, and thus the flexible printed wiring board 1 is thin and flexible enough.

The thickness of the metal foil 10 in the metal foil-bonded resin sheet 9 is not particularly limited, but for example 9 to 70 µm. The thickness of the second resin layer 8 when the metal foil-bonded resin sheet 9 has a second resin layer 8 is also not particularly limited, but preferably in the range of 5 to 25 µm.

The first resin layer 7 preferably has high resin flow and additionally, the second insulating layer 4, which is formed of the first resin layer 7, preferably has, for example, high flexibility, heat resistance, and chemical resistance. Thus, the composition of the thermosetting resin composition used for preparation of the first resin layer 7 is very important. For preparation of such a first resin composition, the thermosetting resin composition is preferably an epoxy resin composition containing an epoxy resin, a curing agent, and a carbodiimide-modified soluble polyamide.

Examples of the epoxy resins in the epoxy resin composition include glycidylether-type epoxy resins, glycidyl ester-type epoxy resins, glycidyl amine-type epoxy resins, oxide-type epoxy resins and the like. Typical examples of the glycidylether-type epoxy resins include bisphenol A-type epoxy resins, bisphenol F-type epoxy resins, novolac-type epoxy resins, alcohol-type epoxy resins and the like. Typical examples of the glycidyl ester-type epoxy resins include hydrophthalic acid-type epoxy resins, dimer acid-type epoxy resins and the like. Typical examples of the glycidyl amine-type epoxy resins include aromatic amine-type epoxy resins, aminophenol-type epoxy resins and the like. Typical examples of the oxide-type epoxy resins include cycloaliphatic epoxy resins. Naphthalene skeleton-containing epoxy resins, phenol and biphenyl skeleton-containing novolac-type epoxy resins (biphenyl novolac epoxy resins), phosphorus-modified epoxy resins (described below) and the like are also included. The epoxy resin preferably contains no halogen.

In particular, the epoxy resin in the epoxy resin composition preferably contains a naphthalene skeleton-containing epoxy resin. In this case, the flexible printed wiring board 1 shows improved heat resistance, migration resistance, and chemical resistance. The naphthalene skeleton-containing epoxy resin is preferably at least one of the compounds represented by Structural Formulae (1) to (3) above. In this case, the flexible printed wiring board 1 shows further improved heat resistance, migration resistance, and chemical resistance.

Examples of the curing agents in the epoxy resin composition include polyamines, modified polyamines, acid anhydrides, hydrazine derivatives, polyphenols and the like. Typical examples of the polyamines include aliphatic polyamines, alicyclic polyamines, aromatic polyamines and the like. Examples of the aliphatic polyamines among them include diethylenetriamine, triethylenetetramine, tetraethylenepentamine, m-xylenediamine, trimethylhexamethylenediamine, 2-methylpentamethylenediamine, diethylaminopropylamine and the like. Examples of the alicyclic polyamines include isophoronediamine, 1,3-bisaminomethylcyclohexane, bis(4-aminocyclohexyl)methane, norbornenediamine, 1,2-diaminocyclohexane, Laromin and the like. Examples of the aromatic polyamines include diaminodiphenylmethane, meta-phenylenediamine, diaminodiphenylsulfone and the like. Examples of the acid anhydrides include hexahydrophthalic anhydride, methyltetrahydro anhydride, methylhexahydrophthalic anhydride, methylnadic anhydride, hydrogenated methylnadic anhydride, trialkyltetrahydrophthalic anhydride, methylcyclohexenetetracarboxylic dianhydride, trimellitic anhydride, pyromellitic anhydride, benzophenonetetracarboxylic dianhydride, aliphatic dibasic acid polyanhydride and the like. Examples of the polyphenol-based curing agents include phenol novolacs, xylene novolacs, bisphenol A novolacs, triphenylmethane novolacs, biphenyl novolacs, dicyclopentadiene phenol novolacs, terpene phenol novolacs and the like. The curing agent may contain an aminotriazine novolac resin, a novolac-type phenol resin or the like.

In particular, the curing agent preferably contains at least an aminotriazine novolac resin represented by Structural Formula (4) or dicyandiamide. In this case, the first resin layer 7 remains in the B stage state reliably for an extended period of time (improvement of storage stability) and the flexible printed wiring board 1 shows improved flame retardancy and chemical resistance.

The content of the curing agent in the epoxy resin composition is preferably in the range of 10 to 45 mass % with respect to the total amount of the epoxy resin, hardening agent, and carbodiimide-modified soluble polyamide in the epoxy resin composition.

The carbodiimide-modified soluble polyamide contained in the epoxy resin composition is prepared, for example, in reaction of a soluble polyamide and a carbodiimide compound in the presence or absence of a solvent at a reaction temperature, for example, of 50 to 250° C.

The soluble polyamide is a polyamide that is completely soluble in a mixture of an alcohol and at least one of aromatic and ketone-based organic solvents in an amount of 1 part or more by mass, preferably 5 parts or more by mass, more preferably 10 parts or more by mass in 100 parts by mass of the mixture. Examples of the alcohols include methanol, ethanol, isopropyl alcohol and the like. Examples of the aromatic organic solvents include benzene, toluene and the like. Examples of the ketone-based organic solvents include cyclohexanone, 2-butanone, cyclopentanone and the like. Preferably, these alcohols, aromatic solvents, and ketone-based solvents have a boiling point of 130° C. or lower.

The soluble polyamide is prepared, for example, by treating a polyamide other than the soluble polyamide (pre-solubilization polyamide) for solubilization. The method for solubilization treatment is, for example, a method of substituting the hydrogen atoms in the amide group in the pre-solubilization polyamide partially with methoxymethyl groups. Introduction of methoxy groups into the polyamide by the method above results in loss of the hydrogen bonding potential of the amide groups, which in turn leads to inhibition of the crystallization of the polyamide and increase of the solubility of the polyamide in a solvent. Another method for solubilization treatment is, for example, a method of introducing polyether or polyester linkages into the molecule of the pre-solubilization polyamide and thus forming a copolymer. Examples of the pre-solubilization polyamides include nylon 6, nylon 6,6, nylon 6,10, nylon 11, nylon 12, nylon 4,6 and the like.

Typical examples of the soluble polyamide include Zytel 61 (trade name) produced by Du Pont, Versalon (trade name) produced by General Mills, Inc., Amilan CM4000 (trade name) produced by Toray Industries, Inc., Amilan CM8000 (trade name) produced by Toray Industries, Inc., PA-100 (trade name) produced by Fuji Kasei Kogyo Co., Ltd., Toresin (trade name) produced by Nagase ChemteX Corporation and the like.

The carbodiimide compound is a compound having one or more carbodiimide groups in the molecule. The carbodiimide compound is, for example, a monocarbodiimide compound, a polycarbodiimide compound or the like. The carbodiimide compound is prepared, for example, by decarboxylative condensation reaction of a polyisocyanate in the absence of a solvent or in the presence of an inactive solvent and in the presence of an organic phosphorus or organic metal compound as catalyst at a temperature of about 70° C. or higher.

Examples of the monocarbodiimide compounds include dicyclohexylcarbodiimide, diisopropylcarbodiimide, dimethylcarbodiimide, diisobutylcarbodiimide, dioctylcarbodiimide, t-butylisopropylcarbodiimide, diphenylcarbodiimide, di-t-butylcarbodiimide, di-β-naphthylcarbodiimide and the like. Among the compounds above, dicyclohexylcarbodiimide and diisopropylcarbodiimide are preferable from the viewpoint of industrial availability.

The polycarbodiimide compounds are produced by various methods. For example, the polycarbodiimide compounds are produced by known polycarbodiimide production methods (see, for example, U.S. Pat. No. 2,941,956, J. Org. Chem. 28, 2069-2075 (1963), and Chemical Review 1981, Vol. 81, No. 4, pp. 619-621).

The carbodiimide compound is not particularly limited if it has one or more carbodiimide groups in the molecule, but polycarbodiimide compound containing two or more carbodiimide groups in the molecule, such as 4,4'-dicyclohexylmethanecarbodiimide, are preferable for improvement of reactivity and anti-hydrolytic stability. In particular, aliphatic or alicyclic polycarbodiimide compounds are preferable. The polymerization degree of the polycarbodiimide compound is preferably in the range of 2 to 30, more preferably in the range of 2 to 20. A polymerization degree of 2 or more is preferable for further improvement of the heat resistance of the printed wiring board, and a polymerization degree of 20 or less is preferable for improvement of the compatibility among the components in the epoxy resin composition.

The polyisocyanates used for production of the polycarbodiimide compounds include organic diisocyanates. Examples of the organic diisocyanates include aromatic diisocyanates, aliphatic diisocyanates, alicyclic diisocyanates, and the mixtures thereof. Typical examples thereof include 1,5-naphthalene diisocyanate, 4,4'-diphenylmethane diisocyanate, 4,4'-diphenyldimethylmethane diisocyanate, 1,3-phenylene diisocyanate, 1,4-phenylene diisocyanate, 2,4-tolylene diisocyanate, 2,6-tolylene diisocyanate, mixtures of 2,4-tolylene diisocyanate and 2,6-tolylene diisocyanate, hexamethylene diisocyanate, cyclohexane-1,4-diisocyanate, xylylene diisocyanate, isophorone diisocyanate, dicyclohexylmethane-4,4'-diisocyanate, methylcyclohexane diisocyanate, tetramethylxylylene diisocyanate, 2,6-diisopropylphenyl diisocyanate, 1,3,5-triisopropylbenzene 2,4-diisocyanate and the like. Among them, aliphatic (including alicyclic) organic diisocyanates are preferable and in particular isophorone diisocyanate, dicyclohexylmethane-4,4'-diisocyanate, tetramethylxylylene diisocyanate, and the mixture thereof are more preferable for improvement of the flexibility and the moisture resistance of the flexible printed wiring board 1.

In production of the polycarbodiimide compound, the polymerization degree of the polycarbodiimide compound can be controlled adequately, for example by regulating the polymerization reaction by cooling the reaction system during polymerization reaction of the polyisocyanate. In this case, the terminals of the polycarbodiimide compound molecule are isocyanate groups. For more adequate control of the polymerization degree of the polycarbodiimide compound, the isocyanate groups of the polycarbodiimide compound may be blocked entirely or partially, in reaction of a compound reactive with isocyanate group (hereinafter, referred to as terminal blocking agent), such as a monoisocyanate compound, with all or part of the isocyanate groups at the terminals of the polycarbodiimide compound molecule. When the polymerization degree of the polycarbodiimide compound is controlled adequately, the soluble polyamide and the polycarbodiimide compound become more compatible with each other and the member having the first resin layer 7 shows improved storage stability.

The monoisocyanate compounds usable as the terminal blocking agents include phenyl isocyanate, tolyl isocyanate, dimethylphenyl isocyanate, cyclohexyl isocyanate, butyl isocyanate, naphthyl isocyanate and the like.

Terminal blocking agents other than monoisocyanate compounds may also be used. Examples of the terminal blocking agents other than monoisocyanate compounds include active hydrogen compounds reactive with isocyanate groups. Examples of such active hydrogen compounds include (i) aliphatic, aromatic, and alicyclic compounds having an —OH group, such as methanol, ethanol, phenol, cyclohexanol, N-methyl ethanolamine, polyethylene glycol monomethyl ether, polypropylene glycol monomethyl ether; (ii) compounds having an =NH group such as diethylamine and dicyclohexylamine; (iii) compounds having a —NH$_2$ group such as butylamine and cyclohexylamine; (iv) compounds having one or more-COOH groups such as succinic acid, benzoic acid, and cyclohexanoic acid; (v) compounds having a —SH group such as ethyl mercaptan, allyl mercaptan, and thiophenol; (vi) compounds having an epoxy group; (vii) acid anhydrides such as acetic anhydride, methyltetrahydrophthalic anhydride, and methylhexahydrophthalic anhydride, and the like.

The decarboxylative condensation reaction of the organic diisocyanate can proceed in the presence of a suitable carbodiimidation catalyst. The carbodiimidation catalyst is preferably an organic phosphorus compound or an organic metal compound (represented by General Formula: M-(OR)$_n$, wherein M is a metal element such as titanium (Ti), sodium (Na), potassium (K), vanadium (V), tungsten (W), hafnium (Hf), zirconium (Zr), lead (Pb), manganese (Mn), nickel (Ni), calcium (Ca) or barium (Ba); R is an alkyl or aryl group having a carbon number of 1 to 20; and n is the valency of M).

Among the carbodiimidation catalysts above, phospholene oxides are used favorably in the organic phosphorus compounds and alkoxides of titanium, hafnium and zirconium are used favorably in the organic metal compounds, particularly for improvement of reactivity. Typical examples of the phospholene oxides include 3-methyl-1-phenyl-2-phospholene-1-oxide, 3-methyl-1-ethyl-2-phospholene-1-oxide, 1,3-dimethyl-2-phospholene-1-oxide, 1-phenyl-2-phospholene-1-oxide, 1-ethyl-2-phospholene-1-oxide, 1-methyl-2-phospholene-1-oxide, and their double-bonded isomers. Among the phospholene oxides above, use of 3-methyl-1-phenyl-2-phospholene-1-oxide is preferable from the point of industrial availability.

The carbodiimide-modified soluble polyamides are prepared in reaction of a soluble polyamide with a carbodiimide compound in the presence or absence of a solvent. In this case, the reactive functional groups of the soluble polyamide, such as carboxyl and amino groups, react with the carbodiimide and isocyanate groups of the carbodiimide compound reactive therewith.

The method of reacting the soluble polyamide with the carbodiimide compound in the presence of a solvent is, for example, a method of adding a soluble polyamide and a carbodiimide compound in a solvent, stirring the solution thus obtained under heat and thus advancing the reaction. It is particularly preferable to add a soluble polyamide first into a solvent, add a carbodiimide compound additionally to the solution thus obtained and then heat and stir the solution under reflux, thus advancing the reaction. Removal of the solvent form the solution after reaction under atmospheric or reduced pressure gives a carbodiimide-modified soluble polyamide.

The method of reacting the soluble polyamide with the carbodiimide compound in the absence of a solvent is, for example, a method of advancing the reaction by a mixing a carbodiimide compound to a soluble polyamide previously melted as heated to a temperature above its melting point or a method of advancing the reaction by mixing and melt-kneading the soluble polyamide and the carbodiimide compound in a twin-screw extruder.

The amount of the carbodiimide compound used for the reaction between the soluble polyamide and the carbodiimide compound is preferably in the range of 0.5 to 20 parts by mass, more preferably in the range of 1 to 10 parts by mass to 100 parts by mass of the soluble polyamide. In this case, the flexible printed wiring board 1 has sufficiently improved moisture resistance and heat resistance, and excessive increase of the plasticity and deterioration of the impact resistance of the flexible printed wiring board 1 are suppressed. Thus, when the carbodiimide compound content is 0.5 part or more by mass, the flexible printed wiring board 1 shows sufficiently improved moisture resistance and heat resistance. Alternatively, when the content is 20 parts or less by mass, excessive increase of the plasticity and deterioration of the impact resistance of the flexible printed wiring board 1 are suppressed.

During the reaction between the soluble polyamide and the carbodiimide compound, there is preferably no compound inhibiting modification of the soluble polyamide in the reaction system and in particular, there are preferably only a carbodiimide compound and a soluble polyamide, and also a solvent used as needed, in the reaction system. Typical examples of the compounds inhibiting modification of the soluble polyamide include epoxy resins, amine resins, melamine resins, phenol resins and the like.

The reaction time between the soluble polyamide and the carbodiimide compound may be set arbitrarily according to the kinds of the soluble polyamide and the carbodiimide compound, reaction method, reaction temperature and others, but is preferably in the range of 1 to 500 minutes, more preferably in the range of 5 to 200 minutes.

The temperature of the reaction system during the reaction between the soluble polyamide and the carbodiimide compound can also be set arbitrarily according to the kinds of the soluble polyamide and the carbodiimide compound, reaction method, reaction temperature and others, but is preferably in the range of 50 to 250° C. Especially, when the soluble polyamide and the carbodiimide compound are reacted in the presence of a solvent, the temperature of the reaction system is preferably in the range of 50 to 150° C., more preferably in the range of 70 to 130° C. Alternatively, when the soluble polyamide and the carbodiimide compound are reacted in the absence of a solvent, the temperature of the reaction system is preferably in the range of 130 to 250° C., more preferably in the range of 150 to 220° C. When the temperature of the reaction system is 50° C. or higher, the reaction between the soluble polyamide and the carbodiimide compound is accelerated sufficiently, leading to rapid modification of the soluble polyamide. Thus, such a temperature is desirable from industrial point of view. In addition, a temperature of the reaction system of 250° C. or lower is favorable, as degradation of the product, for example by decomposition of the resin, proceeds less easily.

When the soluble polyamide and the carbodiimide compound react with each other, as described above, the soluble polyamide is modified and gives a carbodiimide-modified soluble polyamide. When the reaction proceeds further, the number of the carbodiimide groups in the carbodiimide compound decreases. Thus, when the raw materials and the product are analyzed by infrared spectroscopy, the peaks corresponding to the carbodiimide group become smaller in the infrared absorption spectrum of the product. Further, when the raw materials and the product are subjected to differential thermogravimetric analysis, there are observed multiple absorption peaks of raw materials including the absorption peak corresponding to the amide resin and the absorption peak corresponding to the carbodiimide resin, but there is only one endothermic peak observed in the product. These facts indicate that the soluble polyamide has been modified.

The composition containing a carbodiimide-modified soluble polyamide is superior in storage stability to compositions containing a soluble polyamide and a carbodiimide compound. Specifically, compositions containing a soluble polyamide and a carbodiimide compound show increase in viscosity of the solution, resulting in easier gelation, when dissolved therein, but the composition containing a carbodiimide-modified soluble polyamide does not show change, for example increase, in viscosity of the solution and thus permits storage of the solution for an extended period of time.

The content of carbodiimide-modified soluble polyamide in the epoxy resin composition is preferably in the range of 20 to 70 mass % with respect to the total amount of the epoxy resin, the curing agent, and the carbodiimide-modified soluble polyamide in the epoxy resin composition. When the content of the carbodiimide-modified soluble polyamide is 20 mass % or more, the flexible printed wiring board 1 shows improved flexibility and, when the content is 70 mass % or less, the flexible printed wiring board 1 shows improved flame retardancy and heat resistance.

The epoxy resin composition may contain, as needed, a curing accelerator such as 2-ethyl-4-methylimidazole additionally.

The epoxy resin composition preferably contains a phenoxy resin additionally. In this case, the flexible printed wiring board 1 shows further improved flexibility. Examples of the phenoxy resins include bisphenol A-type phenoxy resins, bisphenol A/bisphenol F-type copolymeric phenoxy resins, phosphorus-modified phenoxy resins (described below) and the like. The content of the phenoxy resin in the epoxy resin composition is preferably in the range of 5 to 30 mass % with respect to the total amount of the epoxy resin composition.

The epoxy resin composition also preferably contains at least one selected from phosphorus-modified epoxy resins, phosphorus-modified phenoxy resins and phosphorus-based flame retardant such as phosphazenes. In this case, the flexible printed wiring board 1 shows further improved flame retardancy. The total content of the phosphorus-modified epoxy resin, the phosphorus-modified phenoxy resin, and the phosphorus-based flame retardant is preferably in the range of 10 to 40 mass % with respect to the total amount of the epoxy resin composition.

The phosphorus-modified epoxy resin is obtained, for example, in reaction of 9,10-dihydro-9-oxa-10-phosphaphenanthrene-10-oxide with 1,4-naphthoquinone and additionally reaction of the product with a cresol novolac resin.

The phosphorus-modified phenoxy resin contains a phenoxy resin as its main skeleton and contains, for example, several (about 1 to 5) phosphorus atoms therein.

Examples of the phosphorus-based flame retardants include phosphazene, monomeric phosphate esters, condensed phosphate esters, reactive phosphorus-based flame retardants, phosphate salts, phosphazene compounds and the like. Typical examples of the monomeric phosphate esters include triphenyl phosphate, tricresyl phosphate, trixylenyl phosphate, triethyl phosphate, cresyl diphenyl phosphate, xylyl diphenyl phosphate, cresyl bis(di-2,6-xylenyl)phosphate, 2-ethylhexyl diphenyl phosphate and the like. Typical examples of the condensed phosphate esters include resorcinol bis(diphenyl)phosphate, bisphenol A bis(diphenyl)phosphate, bisphenol A bis(dicresyl)phosphate, resorcinol bis(di-2,6-xylenyl)phosphate and the like. Typical examples of the reactive phosphorus-based flame retardants include bisphenol A bisphenyl phosphate, 9,10-dihydro-9-oxa-10-phosphaphenanthrene-10-oxide, 2-(diphenylphosphinyl)hydroquinone and the like. Typical examples of the phosphate salts include melamine phosphate, dimelamine phosphate, melamine pyrophosphate, dimelamine pyrophosphate, melamine polyphosphate, ethylenediamine phosphate and the like. Typical examples of the phosphazene compounds include phosphonitrilic phenyl ester, mixed cyanophenol/phenol-substituted cyclophosphazenes, phosphonitrilic chloride-hydroquinone-phenol condensates and the like.

The epoxy resin composition preferably contains no filler. Generally, a filler such as aluminum hydroxide or magnesium hydroxide is used occasionally as the flame retardant, but it is preferably not to use such a filler. In this case, the flexible printed wiring board gives a smaller number of fine cracks on the second insulating layer 4 when it is bent, preventing deterioration in appearance of the flexible printed wiring board and preserving high-reliability insulation by the second insulating layer 4.

The epoxy resin composition is prepared by blinding the components described above. The epoxy resin composition may contain, as needed, an organic solvent additionally for viscosity adjustment.

The epoxy resin composition thus obtained, if it contains a carbodiimide-modified soluble polyamide, shows improved storage stability, adhesiveness, flexibility, and filling efficiency. The carbodiimide-modified soluble polyamide, which is prepared in reaction between the reactive functional groups such as carboxyl and amino groups of the soluble polyamide and the carbodiimide and isocyanate groups of the carbodiimide compound reactive therewith, is less reactive with the epoxy resin at low temperature. Thus, the epoxy resin composition shows better storage stability and the member having the first resin layer 7 prepared from the epoxy resin composition shows better storage stability and pressure-molding efficiency. In addition, it is possible to balance favorably the handling efficiency and processability (storage stability and pressure-molding efficiency) of the epoxy resin composition and the first resin layer 7 with the various properties (adhesiveness, flexibility, filling efficiency, etc.) of the flexible printed wiring board 1.

Further, when the epoxy resin composition contains a carbodiimide-modified soluble polyamide, the epoxy resin composition for printed wiring board shows improvement in insulation properties and also in flame retardancy, heat resistance, and chemical resistance.

It is possible to prepare a high-resin flow first resin layer 7 from an epoxy resin composition having such a composition. The resin flow of the first resin layer 7 can be controlled easily by modifying the heating temperature and the heating rate when the first resin layer 7 is formed by drying of the coated film of the epoxy resin composition under heat.

The metal foil-bonded resin sheet 9 consisting of a metal foil 10 and a first resin layer 7 is prepared by coating an epoxy resin composition on the metal foil 10 and additionally half-hardening the epoxy resin composition by drying under heat. In this case, a first resin layer 7 of the half-hardened epoxy resin composition is formed. The heating condition when the epoxy resin composition is dried under heat may be determined arbitrarily, but the heating temperature is preferably in the range of 130° C. to 160° C. and the heating time is preferably in the range of 2 to 10 minutes.

The second resin layer 8 in the metal foil-bonded resin sheet 9 consisting of a metal foil 10, a second resin layer 8, and a first resin layer 7 is prepared, for example, by coating a liquid resin, such as a liquid polyimide resin, on the metal foil 10 and hardening or half-hardening the liquid resin. In this case, a second resin layer 8 of the hardened or half-hardened liquid resin is formed. Alternatively, the second resin layer 8 is formed, for example, by coating a liquid resin such as a liquid polyimide resin on the metal foil 10 and additionally placing a resin film such as a polyimide film on the liquid resin. In this case, a second resin layer 8 consisting of the hardened product or half-hardened liquid resin and the resin film is formed. A first resin layer 7 of a half-hardened epoxy resin composition is formed, by coating an epoxy resin composition on the second resin layer 8 and additionally half-hardening the epoxy resin composition by drying under heat.

Examples

Synthesis of Carbodiimide Compound

A carbodiimide compound 4,4'-dicyclohexylmethanecarbodiimide resin (polymerization degree: 10) was obtained by reacting 590 g of 4,4'-dicyclohexylmethane diisocyanate, 62.6 g of cyclohexyl isocyanate with each other under 6.12 g of a carbodiimidation catalyst (3-methyl-1-phenyl-2-phospholene 1-oxide) at 180° C. for 48 hours.

(Synthesis of Carbodiimide-Modified Soluble Polyamide)

In a 1-liter separable flask, 50.0 g of an ester-copolymerized amide resin (trade name: "CM8000", produced by Toray Industries, Inc.) was dissolved in 450.0 g of a mixed solvent of isopropyl alcohol and toluene (mass blending ratio: 4:6) with stirred. To the solution thus obtained, 5.0 g of the carbodiimide compound (4,4'-dicyclohexylmethanecarbodiimide resin) above was added; the mixture was heated and stirred under reflux for 3 hours, as the flask was immersed in an oil bath at 120° C.; removal of the solvent by drying under reduced pressure gave a carbodiimide-modified soluble polyamide.

Infrared spectrophotometric analysis of the carbodiimide-modified soluble polyamide showed an absorption peak at 2120 $cm^{-1}$ indicating the presence of carbodiimide group. Separately, differential scanning calorimetry of the carbodiimide-modified soluble polyamide showed one endothermic peak. The glass transition temperature ($T_g$) of the carbodiimide-modified soluble polyamide was found to be 120° C., the 5%-weight-loss temperature was 320° C., and the solution viscosity was 860 mPa·s.

The carbodiimide-modified soluble polyamide was added to a mixed solvent of isopropyl alcohol and toluene (mass blending ratio: 4:6), to give a solution of the carbodiimide-modified soluble polyamide at a solid matter concentration of 11 mass %.

(Preparation of Laminates)

Epoxy resin compositions of Examples 1 to 19 and Comparative Examples 1 and 2 (solid content: 30 mass %) were prepared according to the blending composition shown in Table 1. The blending compositions shown in Table 1 are all solid matter rates.

In Examples 7 to 19, an epoxy resin composition was applied on a polyimide film (thickness: 8 μm, produced by Panasonic Corporation, product number: R-F552) bonded to a copper foil (thickness: 12 μm) with a comma coater and a drier connected thereto, and the epoxy resin composition was then dried under heat, to give a first resin layer having a

TABLE 1

|  |  | Examples 1 to 6 and Comparative Examples 1 and 2 | Example |||||||||||||
|---|---|---|---|---|---|---|---|---|---|---|---|---|---|---|---|
|  |  |  | 7 | 8 | 9 | 10 | 11 | 12 | 13 | 14 | 15 | 16 | 17 | 18 | 19 |
| Blending composition (mass %) | Epoxy resin A | 0.0 | 32.2 | 30.3 | 20.9 | 16.4 | 27.2 | 22.9 | 0 | 28.5 | 0 | 0 | 24.9 | 21.6 | 44.0 |
|  | Epoxy resin B | 0.0 | 0.0 | 0 | 0 | 0 | 0 | 0 | 0 | 0 | 33.0 | 0 | 0 | 0 | 0 |
|  | Epoxy resin C | 0.0 | 0.0 | 0 | 0 | 0 | 0 | 0 | 0 | 0 | 0 | 27.6 | 0 | 0 | 0 |
|  | Epoxy resin D | 0.0 | 0.0 | 0 | 0 | 0 | 0 | 0 | 29.3 | 0 | 0 | 0 | 0 | 0 | 0 |
|  | Epoxy resin E | 24.0 | 12.8 | 0 | 0 | 0 | 0 | 0 | 0 | 0 | 0 | 0 | 9.9 | 0 | 0 |
|  | Curing agent A | 0 | 0 | 17.2 | 10.8 | 8.5 | 0 | 0 | 15.6 | 0 | 14.6 | 20.0 | 16.1 | 13.3 | 0 |
|  | Curing agent B | 0 | 0 | 0 | 0 | 0 | 17.7 | 15 | 0 | 0 | 0 | 0 | 0 | 0 | 0 |
|  | Curing agent C | 0 | 0 | 0 | 0 | 0 | 0 | 0 | 0 | 13.4 | 0 | 0 | 0 | 0 | 0 |
|  | Curing agent D | 0.8 | 1.9 | 0 | 0 | 0 | 0 | 0 | 0 | 0 | 0 | 0 | 0 | 0 | 1.9 |
|  | Carbodiimide-modified soluble polyamide | 48.1 | 43.0 | 42.4 | 58.2 | 65.0 | 45.0 | 42.0 | 45.0 | 48.0 | 42.3 | 42.3 | 42.0 | 45.0 | 44.0 |
|  | Phenoxy resin | 10.0 | 0 | 0 | 0 | 0 | 0 | 10 | 0 | 0 | 0 | 0 | 0 | 0 | 0 |
|  | Curing accelorator | 0.1 | 0.1 | 0.1 | 0.1 | 0.1 | 0.1 | 0.1 | 0.1 | 0.1 | 0.1 | 0.1 | 0.1 | 0.1 | 0.1 |
|  | Phosphazene | 17.0 | 10.0 | 10.0 | 10.0 | 10.0 | 10.0 | 10.0 | 10.0 | 10.0 | 10.0 | 10.0 | 7.0 | 9.0 | 10 |
|  | Phosphorus-modified phenoxy resin | 0 | 0 | 0 | 0 | 0 | 0 | 0 | 0 | 0 | 0 | 0 | 0 | 11.0 | 0 |

*Blending composition: solid matter rate
Epoxy resin A: epoxy resin represented by Structural Formula (1) (produced by Nippon Kayaku Co., Ltd., product number: NC-7000L)
Epoxy resin B: epoxy resin represented by Structural Formula (2) (produced by DIC Corporation, product number: EXA-9900)
Epoxy resin C: epoxy resin represented by Structural Formula (3) (produced by DIC Corporation, product number: HP-4700)
Epoxy resin D: halogen-free biphenyl novolac epoxy resin having phenol and biphenyl skeletons (produced by Nippon Kayaku Co., Ltd., product number: NC-3000)
Epoxy resin E: phosphorus-modified epoxy resin (produced by Nippon Steel Chemical Co., Ltd., product number: FX-289EK75, methylethylketone solution having a resin solid content of 70 mass %)
Curing agent A: phenol novolac-type aminotriazine novolac resin represented by Structural Formula (4) (wherein, R is H) (produced by DIC Corporation, product number: LA-7052, methylethylketone solution having a resin solid content of 60 mass %)
Curing agent B: cresol novolac-type amino triazine novolac resin represented by Structural Formula (4) (wherein, R is $CH_3$) (produced by DIC Corporation, product number: LA-3018-50P, propylene glycol monomethylether solution having a resin solid content of 50 mass %)
Curing agent C: phenol novolac resin (produced by DIC Corporation, product number: TD-2090-60M, methylethylketone solution having a resin solid content of 60 wt %)
Curing agent D: dicyandiamide
Phenoxy resin: phenoxy resin (produced by Nippon Steel Chemical Co., Ltd., product number: YP-50, methylethylketone solution having a resin solid content of 65 mass %)
Curing accelerator: 2-ethyl-4-methylimidazole (produced by Shikoku Chemical Corporation, product number: 2E4MZ)
Phosphazene: phosphazene represented by the following formula (5) (produced by Otsuka Chemical Co., Ltd., product number: SPB-100)
[Formula 3]

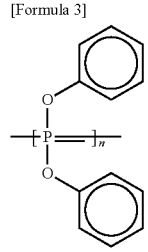

(5)

(wherein, $n$ = 3 to 25)
Phosphorus-modified phenoxy resin: phosphorus-modified phenoxy resin (produced by Tohto Kasei Co., Ltd., product number: ERF-001M30, mixed solvent solution of diglyme, xylene, methyl cellosolve, DMF, and toluene (mass blending ratio: 10:5:30:10:15), resin solid content: 30 mass %)

In Examples 1 to 6 and Comparative Examples 1 and 2, an epoxy resin composition was applied on a copper foil (thickness: 12 μm) with a comma coater and a drier connected thereto and the epoxy resin composition was then dried under heat, to give the first resin layer having a thickness shown in Tables 2 to 4. In preparation of the first resin layer, the resin flow of the first resin layer was controlled by modifying the drying rate of the epoxy resin composition in each Example or Comparative Example. In this way, a metal foil-bonded resin sheet having a metal foil (copper foil) and a first resin layer was obtained.

thickness shown in Tables 2 to 4. In preparation of the first resin layer, the resin flow of the first resin layer was controlled by modifying the drying rate of the epoxy resin composition in each Example. In this way, a metal foil-bonded resin sheet having a metal foil (copper foil), a first resin layer and a second resin layer was obtained.

Results obtained by measuring the resin flow of the first resin layer in each Example or Comparative Example are summarized in Tables 2 to 4.

Flexible laminated sheets containing a first insulating layer of a polyimide film having a thickness of 25 μm and copper foils laminated on both faces of the polyimide having a thickness shown in Tables 2 to 4 were prepared. A conductor wiring was formed on the copper foils on both faces of the flexible laminated sheet by etching treatment. In addition, through holes having an opening diameter of 200 μm were formed by making openings in the first insulating layer by drilling and by through-hole plating of the internal surface of the openings. In this way, a core material was obtained. The thickness, the line width, and the line gap of the conductor wiring on the core material in each Example or Comparative Example are summarized in Tables 2 to 4.

The metal foil-bonded resin sheets were laid on both sides of the core material and the composite was placed between heat plates. In Examples 1 to 19 and Comparative Example 1, there were metal plates, but not cushioning materials, placed between the metal foil-bonded resin sheet and the heat plates. Alternatively, in Comparative Example 2, there were placed metal plates between the metal foil-bonded resin sheets and the heat plates and additionally cushioning materials between the metal plates and the metal foil-bonded resin sheets. The core material and the metal foil-bonded resin sheets were heated and pressurized by the heat plates in that state. The heating temperature was 180° C., the pressure was 1.5 MPa, and the heating time was 1 hour.

In this way, a laminate for evaluation was obtained. The laminate has a first insulating layer and a conductor wiring derived from the core material and a second insulating layer and a metal foil derived from the metal foil-bonded resin sheet. In the laminates obtained in Examples 7 to 19, the second insulating layer includes of a third insulating layer and a fourth insulating layer. The thickness from the surface of the conductor wiring to the surface of the second insulating layer in the laminates obtained in Examples 1 to 6 and Comparative Examples 1 and 2 and the thickness from the surface of the conductor wiring to the surface of the third insulating layer in the laminates obtained in Examples 7 to 19 are shown in Tables 2 to 4.

(Evaluation of Surface Waviness)

The surface of the second insulating layer of the laminate obtained in each Example or Comparative Example was exposed, as the copper foil in the outermost layer was removed completely by etching treatment of the entire surface. The surface waviness of the part of the second insulating layer covering the conductor wiring was determined by using a surface roughness meter (type: SURF TEST SV-3000, produced by Mitsutoyo Corporation). The results are summarized in Tables 2 to 4.

(Evaluation of Filling Efficiency)

The laminate obtained in each Example or Comparative Example was cut into pieces and the filling efficiency of the second insulating layer into the spaces between the lines of the conductor wiring and also in through holes observable on the cross section was determined. Those without filling defect were indicated by "favorable" and those with filling defect by "unfavorable". The results are summarized in Tables 2 to 4.

(Evaluation of Flexibility)

The flexibility of the laminate obtained in each Example or Comparative Example was evaluated, based on the test results obtained by MIT method, after the copper foil in the outermost layer was removed completely by etching. The measuring condition is as follows: R: 0.38 mm, load: 500 g, and bending frequency: 175 times/minute. The bending frequency needed to cause conductivity defects in the conductor wiring was determined.

(Evaluation of Wiring Accuracy)

An etching resist of a dry-film photoresist was formed on the copper foil in the outermost layer of the laminate obtained in each Example or Comparative Example. The patterning shape of the etching resist was designed to have a second conductor wiring having a line width of 100 μm and a line gap of 100 μm. The copper foil was then subjected to etching treatment and the etching resist was removed. In this way, a second conductor wiring was formed.

The positional accuracy and the dimensional accuracy of the second conductor wiring were evaluated by observation under optical microscope. Those without thinning or breakage in the pattern of the second conductor wiring were determined to be satisfactory, while those with defects such as thinning and breakage were determined to be unsatisfactory. The results are summarized in Tables 2 to 4.

TABLE 2

|  | Example | | | | | | Comparative Example | |
| --- | --- | --- | --- | --- | --- | --- | --- | --- |
|  | 1 | 2 | 3 | 4 | 5 | 6 | 1 | 2 |
| Thickness of copper foil in the resin sheet with metal foil (μm) | 12 | 12 | 12 | 12 | 12 | 12 | 12 | 12 |
| Thickness of first resin layer in the resin sheet with metal foil (μm) | 10 | 40 | 40 | 10 | 40 | 40 | 40 | 40 |
| Resin flow of first resin layer in the resin sheet with metal foil (mass %) | 25 | 25 | 25 | 10 | 15 | 20 | 1 | 1 |
| Thickness of conductor wiring on core material (μm) | 12 | 18 | 28 | 12 | 18 | 28 | 28 | 28 |
| Line width of conductor wiring on core material (μm) | 50 | 50 | 50 | 1000 | 1000 | 1000 | 1000 | 1000 |
| Line gap of conductor wiring on core material (μm) | 50 | 50 | 50 | 1000 | 1000 | 1000 | 1000 | 1000 |
| Thickness from the surface of conductor wiring to the surface of second insulating layer in the laminate (μm) | 3 | 30 | 26 | 4 | 30 | 23 | 40 | 40 |
| Presence of cushioning material during heat-pressure molding | No | No | No | No | No | No | No | Yes |

TABLE 2-continued

|  | Example | | | | | | Comparative Example | |
|---|---|---|---|---|---|---|---|---|
|  | 1 | 2 | 3 | 4 | 5 | 6 | 1 | 2 |
| Surface Waviness (μm) | 2 | 2 | 3 | 3 | 3 | 5 | — | 38 |
| Filling efficiency | Favorable | Favorable | Favorable | Favorable | Favorable | Favorable | Unfavorable | Favorable |
| Flexibility | 720 | 570 | 570 | 690 | 540 | 510 | — | 500 |
| Wiring accuracy | Satisfactory | Satisfactory | Satisfactory | Satisfactory | Satisfactory | Satisfactory | — | Unsatisfactory |

TABLE 3

|  | Example | | | | | | | |
|---|---|---|---|---|---|---|---|---|
|  | 7 | 8 | 9 | 10 | 11 | 12 | 13 | 14 |
| Thickness of copper foil in the resin sheet with metal foil (μm) | 12 | 12 | 12 | 12 | 12 | 12 | 12 | 12 |
| Thickness of second resin layer in the resin sheet with metal foil (μm) | 8 | 8 | 8 | 8 | 8 | 8 | 8 | 8 |
| Thickness of first resin layer in the resin sheet with metal foil (μm) | 25 | 25 | 25 | 25 | 25 | 25 | 25 | 25 |
| Resin flow of first resin layer in the resin sheet with metal foil (mass %) | 21 | 18 | 20 | 20 | 18 | 21 | 21 | 18 |
| Thickness of conductor wiring on core material (μm) | 18 | 18 | 18 | 18 | 18 | 18 | 18 | 18 |
| Line width of conductor wiring on core material (μm) | 1000 | 1000 | 1000 | 1000 | 1000 | 1000 | 1000 | 1000 |
| Line gap of conductor wiring on core material (μm) | 1000 | 1000 | 1000 | 1000 | 1000 | 1000 | 1000 | 1000 |
| Thickness from the surface of conductor wiring to the surface of second insulating layer in the laminate (μm) | 15 | 16 | 15 | 16 | 16 | 15 | 15 | 16 |
| Presence of cushioning material during heat-pressure molding | No | No | No | No | No | No | No | No |
| Surface Waviness (μm) | 3 | 3 | 3 | 3 | 3 | 5 | 4 | 3 |
| Filling efficiency | Favorable | Favorable | Favorable | Favorable | Favorable | Favorable | Favorable | Favorable |
| Flexibility | 610 | 600 | 580 | 600 | 650 | 570 | 570 | 630 |
| Wiring accuracy | Satisfactory | Satisfactory | Satisfactory | Satisfactory | Satisfactory | Satisfactory | Satisfactory | Satisfactory |

TABLE 4

|  | Example | | | | |
|---|---|---|---|---|---|
|  | 15 | 16 | 17 | 18 | 19 |
| Thickness of copper foil in the resin sheet with metal foil (μm) | 12 | 12 | 12 | 12 | 12 |
| Thickness of second resin layer in the resin sheet with metal foil (μm) | 8 | 8 | 8 | 8 | 8 |
| Thickness of first resin layer in the resin sheet with metal foil (μm) | 25 | 25 | 25 | 25 | 25 |
| Resin flow of first resin layer in the resin sheet with metal foil (mass %) | 20% | 21% | 20% | 20% | 18% |
| Thickness of conductor wiring on core material (μm) | 18 | 18 | 18 | 18 | 18 |
| Line width of conductor wiring on core material (μm) | 1000 | 1000 | 1000 | 1000 | 1000 |
| Line gap of conductor wiring on core material (μm) | 1000 | 1000 | 1000 | 1000 | 1000 |

TABLE 4-continued

| | Example | | | | |
|---|---|---|---|---|---|
| | 15 | 16 | 17 | 18 | 19 |
| Thickness from the surface of conductor wiring to the surface of second insulating layer in the laminate (μm) | 16 | 15 | 16 | 16 | 16 |
| Presence of cushioning material during heat-pressure molding | No | No | No | No | No |
| Surface Waviness (μm) | 3 | 4 | 3 | 3 | 3 |
| Filling efficiency | Favorable | Favorable | Favorable | Favorable | Favorable |
| Flexibility | 550 | 560 | 610 | 580 | 600 |
| Wiring accuracy | Satisfactory | Satisfactory | Satisfactory | Satisfactory | Satisfactory |

REFERENCE SIGNS LIST

1 Flexible printed wiring board
2 First insulating layer
3 First conductor wiring
4 Second insulating layer
41 Third insulating layer
42 Fourth insulating layer
6 Through hole
7 First resin layer
8 Second resin layer
9 Metal foil
10 Metal foil-bonded resin sheet
14 Laminate for production of a flexible printed wiring board

The invention claimed is:

1. A flexible printed wiring board, comprising
a first insulating layer that is flexible,
a first conductor wiring laminated on the first insulating layer,
a second insulating layer that is a single layer and laminated on the first insulating layer, as it covers the first conductor wiring, and
a second conductor wiring laminated on the second insulating layer, wherein:
the first conductor wiring has a thickness in the range of 10 to 30 μm, a line width in the range of 50 μm to 1 mm, and a line gap in the range of 50 μm to 1 mm;
a thickness from a surface of the first conductor wiring to a surface of the second insulating layer is in the range of 5 to 30 μm;
a surface waviness of part of the second insulating layer covering the first conductor wiring is 10 μm or less;
the second insulating layer is made of a hardened product of an epoxy resin composition containing an epoxy resin, a curing agent, and a carbodiimide-modified soluble polyamide; and
the epoxy resin contains a naphthalene skeleton-containing epoxy resin.

2. A flexible printed wiring board, comprising
a first insulating layer that is flexible,
a first conductor wiring laminated on the first insulating layer,
a second insulating layer that is laminated on the first insulating layer, as it covers the first conductor wiring, and
a second conductor wiring laminated on the second insulating layer, wherein:
the second insulating layer includes a third insulating layer directly laminated on the first insulating layer and a fourth insulating layer laminated on the third insulating layer;
the first conductor wiring has a thickness in the range of 10 to 30 μm, a line width in the range of 50 μm to 1 mm, and a line gap in the range of 50 μm to 1 mm;
a thickness from a surface of the first conductor wiring to a surface of the third insulating layer, among the multiple layers constituting the second insulating layer, is in the range of 5 to 30 μm;
a surface waviness of part of the second insulating layer covering the first conductor wiring is 10 μm or less;
the third insulating layer is made of a hardened product of an epoxy resin composition containing an epoxy resin, a curing agent, and a carbodiimide-modified soluble polyamide; and
the epoxy resin contains a naphthalene skeleton-containing epoxy resin.

3. The flexible printed wiring board as set forth in claim 1, wherein a content of the carbodiimide-modified soluble polyamide in the epoxy resin composition is in the range of 40 to 70 mass %.

4. The flexible printed wiring board as set forth in claim 1, wherein the naphthalene skeleton-containing epoxy resin contains at least one compound selected from compounds represented by the following formulae (1) to (3):

[Formula 1]

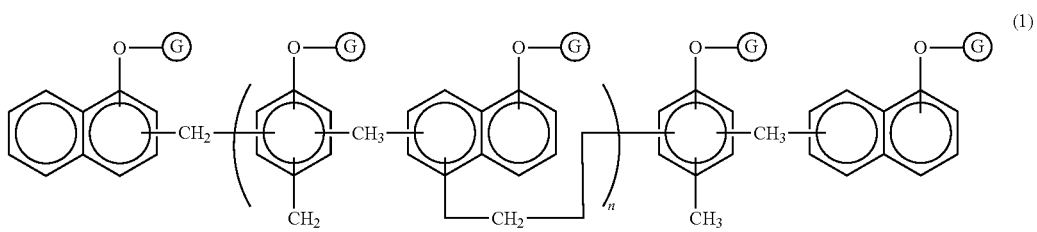

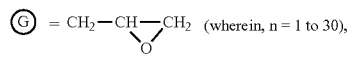 (wherein, n = 1 to 30),

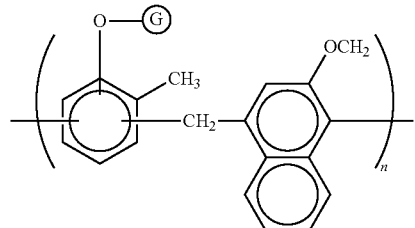 (2)

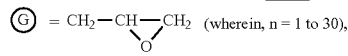 (wherein, n = 1 to 30),

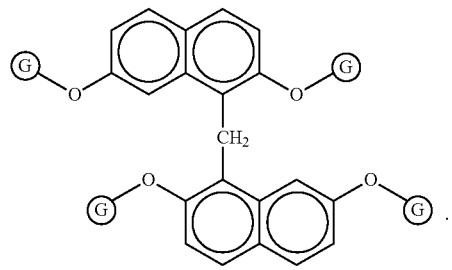 (3)

5. The flexible printed wiring board as set forth in claim 1, wherein the curing agent contains at least one of dicyandiamide and aminotriazine novolac resins represented by the following formula (4):

[Formula 2]

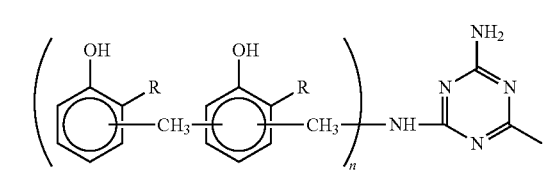 (4)

R = H or CH₃
(wherein, n = 1 to 30).

6. The flexible printed wiring board as set forth in claim 1, wherein the carbodiimide-modified soluble polyamide contains a reaction product of 100 parts by mass of a soluble polyamide and 0.5 to 20 parts by mass of a carbodiimide compound.

7. The flexible printed wiring board as set forth in claim 1, wherein the epoxy resin composition contains a phenoxy resin.

8. The flexible printed wiring board as set forth in claim 1, wherein the epoxy resin composition contains at least one compound selected from phosphorus-modified epoxy resins, phosphorus-modified phenoxy resins, and phosphorus-based flame retardants.

9. The flexible printed wiring board as set forth in claim 1, wherein a through hole is formed in the first insulating layer and part of the second insulating layer fills the through hole.

10. A laminate for production of a flexible printed wiring board comprising:

a first insulating layer that is flexible,
a first conductor wiring laminated on the first insulating layer,
a second insulating layer that is a single layer and laminated on the first insulating layer, as it covers the first conductor wiring, and
a metal foil laminated on the second insulating layer, wherein
the first conductor wiring has a thickness in the range of 10 to 30 μm, a line width in the range of 50 μm to 1 mm, and a line gap in the range of 50 μm to 1 mm;
a thickness from a surface of the first conductor wiring to a surface of the second insulating layer is in the range of 5 to 30 μm;
a surface waviness of part of the second insulating layer covering the first conductor wiring is 10 μm or less;
the second insulating layer is made of a hardened product of an epoxy resin composition containing an epoxy resin, a curing agent, and a carbodiimide-modified soluble polyamide; and
the epoxy resin contains a naphthalene skeleton-containing epoxy resin.

11. A laminate for production of a flexible printed wiring board comprising
a first insulating layer that is flexible,
a first conductor wiring laminated on the first insulating layer,
a second insulating layer that is laminated on the first insulating layer, as it covers the first conductor wiring, and
a metal foil laminated on the second insulating layer, wherein
the second insulating layer includes a third insulating layer directly laminated on the first insulating layer and a fourth insulating layer laminated on the third insulating layer;

the first conductor wiring has a thickness in the range of 10 to 30 μm, a line width in the range of 50 μm to 1 mm, and a line gap in the range of 50 μm to 1 mm;
a thickness from a surface of the first conductor wiring to a surface of the third insulating layer, among the multiple layers constituting the second insulating layer, is in the range of 5 to 30 μM;
a surface waviness of part of the second insulating layer covering the first conductor wiring is 10 μm or less;
the third insulating layer is made of a hardened product of an epoxy resin composition containing an epoxy resin, a curing agent, and a carbodiimide-modified soluble polyamide; and
the epoxy resin contains a naphthalene skeleton-containing epoxy resin.

12. The flexible printed wiring board as set forth in claim 2, wherein a content of the carbodiimide-modified soluble polyamide in the epoxy resin composition is in the range of 40 to 70 mass %.

13. The flexible printed wiring board as set forth in claim 2, wherein the naphthalene skeleton-containing epoxy resin contains at least one compound selected from compounds represented by the following formulae (1) to (3):

14. The flexible printed wiring board as set forth in claim 2, wherein the curing agent contains at least one of dicyandiamide and aminotriazine novolac resins represented by the following formula (4):

[Formula 4]

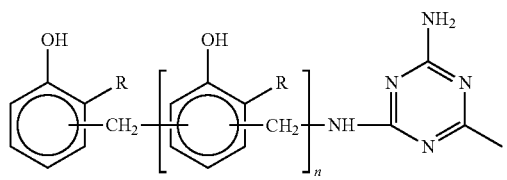

(4)

R = H or CH$_3$
(wherein, n = 1 to 30).

15. The flexible printed wiring board as set forth in claim 2, wherein the carbodiimide-modified soluble polyamide contains a reaction product of 100 parts by mass of a soluble polyamide and 0.5 to 20 parts by mass of a carbodiimide compound.

[Formula 3]

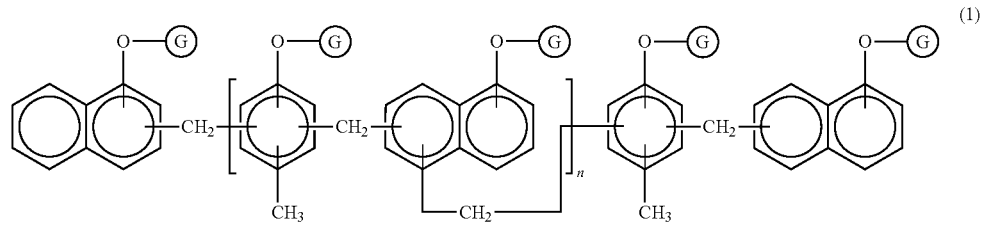

(1)

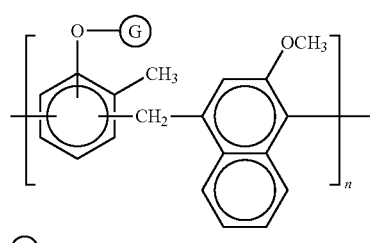

(2)

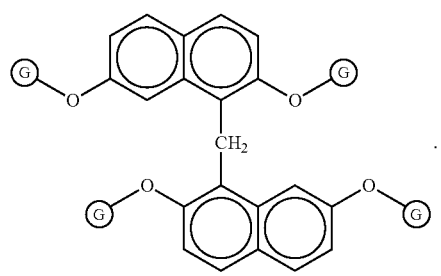

(3)

16. The flexible printed wiring board as set forth in claim 2, wherein the epoxy resin composition contains a phenoxy resin.

17. The flexible printed wiring board as set forth in claim 2, wherein the epoxy resin composition contains at least one compound selected from phosphorus-modified epoxy resins, phosphorus-modified phenoxy resins, and phosphorus-based flame retardants.

18. The flexible printed wiring board as set forth in claim 2, wherein a through hole is formed in the first insulating layer and part of the second insulating layer fills the through hole.

* * * * *